(12) United States Patent
Niimi et al.

(10) Patent No.: US 12,284,820 B2
(45) Date of Patent: Apr. 22, 2025

(54) DUAL METAL WRAP-AROUND CONTACTS FOR SEMICONDUCTOR DEVICES

(71) Applicant: Tokyo Electron Limited, Tokyo (JP)

(72) Inventors: Hiroaki Niimi, Albany, NY (US); Kandabara N Tapily, Albany, NY (US); Takahiro Hakamata, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 575 days.

(21) Appl. No.: 17/841,225

(22) Filed: Jun. 15, 2022

(65) Prior Publication Data

US 2022/0310812 A1    Sep. 29, 2022

Related U.S. Application Data

(62) Division of application No. 16/803,987, filed on Feb. 27, 2020, now Pat. No. 11,374,101.

(Continued)

(51) Int. Cl.
*H10D 30/62* (2025.01)
*H01L 21/285* (2006.01)
(Continued)

(52) U.S. Cl.
CPC ........ *H10D 30/6219* (2025.01); *H10D 30/62* (2025.01); *H10D 84/853* (2025.01);
(Continued)

(58) Field of Classification Search
None
See application file for complete search history.

(56) References Cited

U.S. PATENT DOCUMENTS

| 9,478,468 B1 | 10/2016 | Cheng |
| 9,548,366 B1 | 1/2017 | Ho |

(Continued)

FOREIGN PATENT DOCUMENTS

| KR | 20150018343 A | 2/2015 |
| TW | 201633509 A | 9/2016 |

(Continued)

OTHER PUBLICATIONS

Korean Intellectual Property Office, International Search Report and Written Opinion for International application No. PCT/US2020/020244, mailed Jun. 19, 2020, 10pp.

(Continued)

*Primary Examiner* — Michelle Mandala
*Assistant Examiner* — Jordan M Klein

(57) ABSTRACT

A semiconductor device includes a first raised feature in a NFET region on a substrate, a first n-type doped epitaxial semiconductor material grown on the first raised feature, the first n-type doped epitaxial material having a first upward facing surface and a first downward facing surface, a first contact metal on the first downward facing surface, and a second contact metal on the first upward facing surface. The device further includes a second raised feature in a PFET region on the substrate, a second p-type doped epitaxial semiconductor material grown on the second raised feature, the second p-type doped epitaxial material having a second upward facing surface and a second downward facing surface, a third contact metal on the second downward facing surface, and a fourth contact metal on the second upward facing surface, wherein the fourth contact metal is different from the second contact metal.

16 Claims, 31 Drawing Sheets

Related U.S. Application Data

(60) Provisional application No. 62/812,120, filed on Feb. 28, 2019, provisional application No. 62/812,103, filed on Feb. 28, 2019.

(51) Int. Cl.
| | |
|---|---|
| *H01L 21/762* | (2006.01) |
| *H01L 21/768* | (2006.01) |
| *H10D 30/01* | (2025.01) |
| *H10D 84/01* | (2025.01) |
| *H10D 84/03* | (2025.01) |
| *H10D 84/85* | (2025.01) |

(52) U.S. Cl.
CPC .... *H01L 21/28518* (2013.01); *H01L 21/2855* (2013.01); *H01L 21/28568* (2013.01); *H01L 21/76224* (2013.01); *H01L 21/76865* (2013.01); *H01L 21/76897* (2013.01); *H10D 30/024* (2025.01); *H10D 84/0193* (2025.01); *H10D 84/038* (2025.01)

(56) References Cited

U.S. PATENT DOCUMENTS

| | | |
|---|---|---|
| 9,768,077 B1 | 9/2017 | Adusumilli |
| 10,128,245 B2 | 11/2018 | Lee |
| 10,964,791 B2 | 3/2021 | Hwang |
| 10,978,354 B2 | 4/2021 | Chu |
| 2014/0203370 A1 | 7/2014 | Maeda |
| 2014/0273365 A1 | 9/2014 | Wei et al. |
| 2015/0041918 A1 | 2/2015 | Wann |
| 2015/0325473 A1 | 11/2015 | Niimi |
| 2016/0086950 A1 | 3/2016 | Eom et al. |
| 2016/0099331 A1* | 4/2016 | Wann .................. H10D 84/834 257/401 |
| 2017/0125289 A1* | 5/2017 | Adusumilli ....... H01L 21/76846 |
| 2017/0186654 A1 | 6/2017 | Li |
| 2018/0138093 A1 | 5/2018 | Adusumilli et al. |
| 2018/0294184 A1 | 10/2018 | Koh |
| 2019/0005180 A1 | 1/2019 | Yeh |
| 2019/0006509 A1 | 1/2019 | Li |
| 2019/0115347 A1 | 4/2019 | Gluschenkov |
| 2019/0157406 A1* | 5/2019 | Hwang .............. H10D 30/6212 |
| 2019/0164966 A1* | 5/2019 | Wang ................. H10D 62/151 |
| 2020/0058562 A1 | 2/2020 | Wu |
| 2020/0058563 A1* | 2/2020 | Wu ................... H10D 30/0212 |
| 2020/0279782 A1 | 9/2020 | Niimi et al. |
| 2020/0279943 A1 | 9/2020 | Niimi |
| 2020/0350314 A1 | 11/2020 | Wang |

FOREIGN PATENT DOCUMENTS

| | | |
|---|---|---|
| TW | 201810532 A | 3/2018 |
| TW | 201838092 A | 10/2018 |
| TW | 201841339 A | 11/2018 |
| TW | 201905741 A | 2/2019 |

OTHER PUBLICATIONS

Notification of Examination Opinions for Taiwan Patent Application No. 109106567, issued on Dec. 7, 2023, 8 pages.
Office Action issued Sep. 8, 2024 in Korean Patent Application No. 10-2021-7030651, filed Sep. 24, 2021, with English translation, 19 pages.

* cited by examiner

DUAL METAL WRAP-AROUND CONTACTS FOR SEMICONDUCTOR DEVICES

CROSS-REFERENCE TO RELATED APPLICATIONS

This application is a divisional application of U.S. patent application Ser. No. 16/803,987, filed Feb. 27, 2020, currently granted as U.S. Pat. No. 11,374,101, which claims priority to U.S. Provisional Patent Application Ser. No. 62/812,103 filed on Feb. 28, 2019, and U.S. Provisional Patent Application Ser. No. 62/812,120 filed on Feb. 28, 2019. All of these applications and patents are incorporated herein by reference, including their specification.

FIELD OF THE INVENTION

The present invention relates to semiconductor devices and methods for manufacturing those devices, and more particularly, to low-resistivity dual metal wrap-around contacts for aggressively scaled devices.

BACKGROUND OF THE INVENTION

Current and future generations of metal-oxide-semiconductor field effect transistors (MOSFETs) require tight control of parasitic capacitance while simultaneously optimizing metal-semiconductor contact resistance. Source and drain contact resistivity is one of the critical parameter that needs to be addressed to improve performance of scaled FinFETs and silicon nanowire/nanosheet devices. The adoption of ultra-thin transistor body structures such as FinFET and fully depleted silicon-on-insulator (FDSOI) has exacerbated the problem of contact resistance for logic manufacturing.

SUMMARY OF THE INVENTION

A semiconductor device and a method for forming a semiconductor device is described in several embodiments of the invention.

According to one embodiment, a semiconductor device includes a first raised feature in a n-type channel field effect transistor (NFET) region on a substrate, a first n-type doped epitaxial semiconductor material grown on the first raised feature, the first n-type doped epitaxial material having a first upward facing surface and a first downward facing surface, a first contact metal on the first downward facing surface, and a second contact metal on the first upward facing surface. The device further includes a second raised feature in a p-type channel field effect transistor (PFET) region on the substrate, a second p-type doped epitaxial semiconductor material grown on the second raised feature, the second p-type doped epitaxial material having a second upward facing surface and a second downward facing surface, a third contact metal on the second downward facing surface, and a fourth contact metal on the second upward facing surface, wherein the fourth contact metal is different from the second contact metal. In one embodiment, the first contact metal contains the same metal as the third contact metal. In another embodiment, the first contact metal is different from the third contact metal.

According to one embodiment, a method of forming a semiconductor device includes providing a first raised feature in a n-type channel field effect transistor (NFET) region on a substrate, growing a first n-type doped epitaxial semiconductor material on the first raised feature, the first n-type doped epitaxial material having a first upward facing surface and a first downward facing surface, forming a first contact metal on the first downward facing surface, forming a second contact metal on the first upward facing surface, providing a second raised feature in a p-type channel field effect transistor (PFET) region on the substrate. The method further includes growing a second p-type doped epitaxial semiconductor material on the second raised feature, the second p-type doped epitaxial material having a second upward facing surface and a second downward facing surface, forming a third contact metal on the second downward facing surface, and forming a fourth contact metal on the second upward facing surface, wherein the fourth contact metal is different from the second contact metal. In one embodiment, the first contact metal contains the same metal as the third contact metal. In another embodiment, the first contact metal is different from the third contact metal.

DETAILED DESCRIPTION OF SEVERAL EMBODIMENTS

A semiconductor device and a method for forming a semiconductor device is described in several embodiments of the invention. Maximizing the contact area in FinFET structures can be achieved by creating a contact that wraps around the fin or by growing faceted epitaxial contacts, and then wrapping metal around the faceted epitaxial contacts. In order to reduce spreading resistance in FinFET structures, wrap around contact (WAC) structures use metal-semiconductor contacts with an increased area.

Figure 1A:
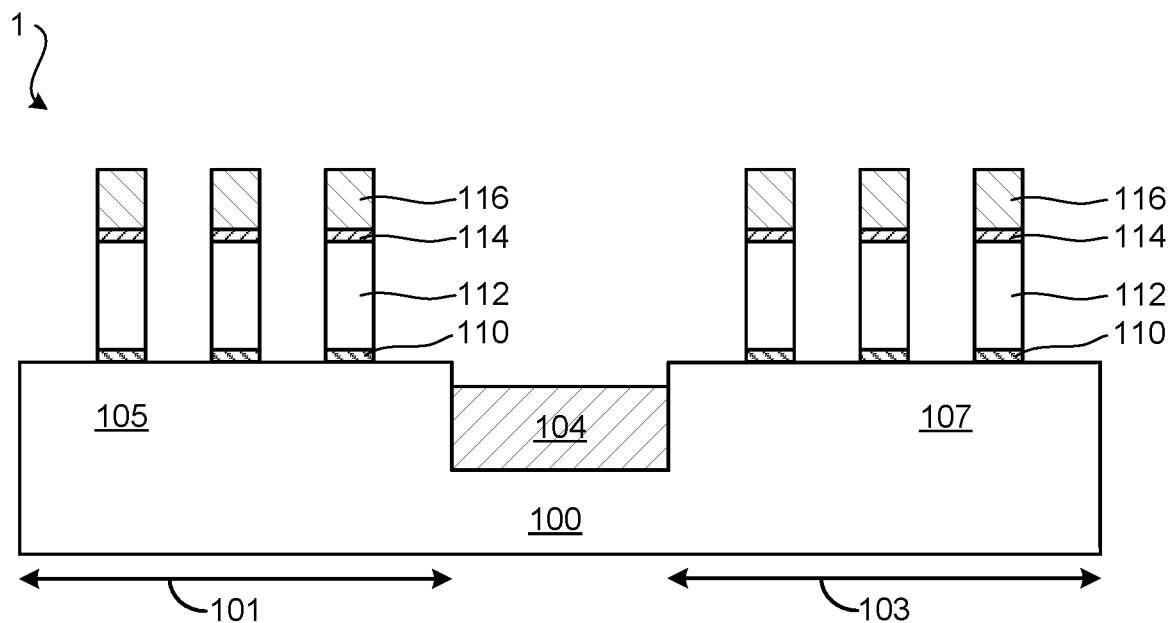
FIGS. 1A-1AA schematically show through cross-sectional views a method of forming a semiconductor device containing dual metal wrap-around contacts according to an embodiment of the invention.

FIGS. 1A-1AA schematically show through cross-sectional views a method of forming a semiconductor device containing dual metal wrap-around contacts according to an embodiment of the invention. FIG. 1A schematically shows a substrate 1 containing a base layer 100 that forms a raised feature 105 in a NFET region 101 and a raised feature 107 in a PFET region 103. The base layer 100 can consist of Si and and a shallow trench isolation (STI) region 104 separating the NFET region 101 and the PFET region 103 can include silicon oxide (SiO$_2$). The substrate 1 further contains three patterned film stacks in each of the NFET region 101 and the PFET region 103. The patterned film stacks each include a sacrificial SiO$_2$ film 110, a dummy polycrystalline-silicon (poly-Si) film 112, a SiO$_2$ hard mask 114, and a silicon nitride (SiN) hard mask 116. The number of the patterned film stacks in FIG. 1A is exemplary and any number of patterned film stacks may be used. The patterned films may be formed using conventional lithography and etching methods.

Figure 1B:
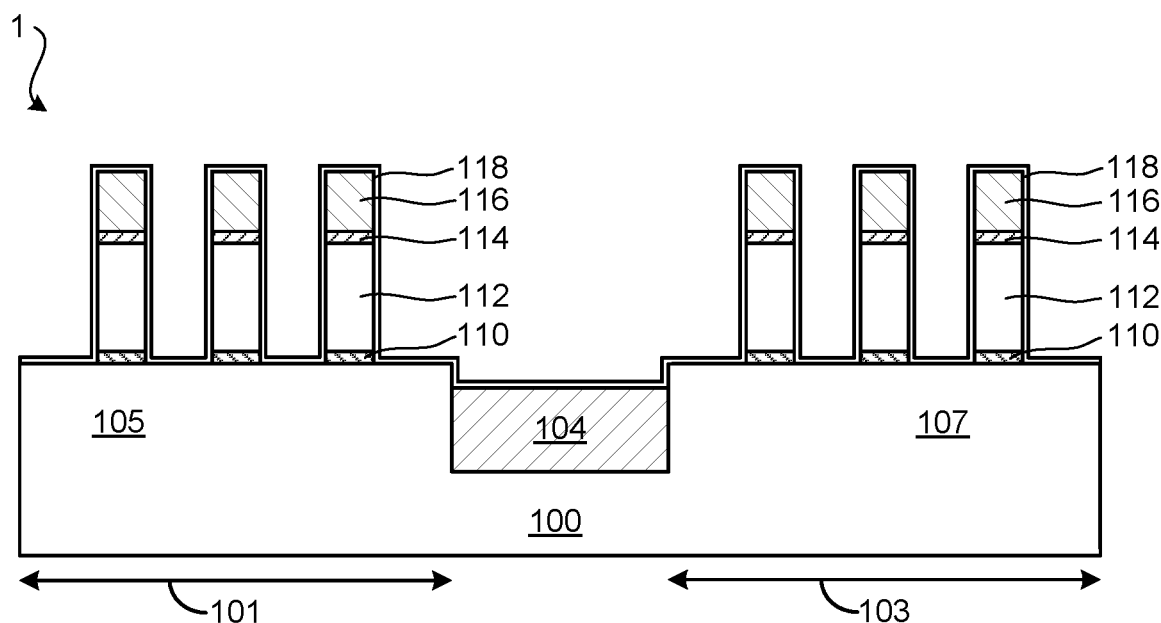
Figure 1A:
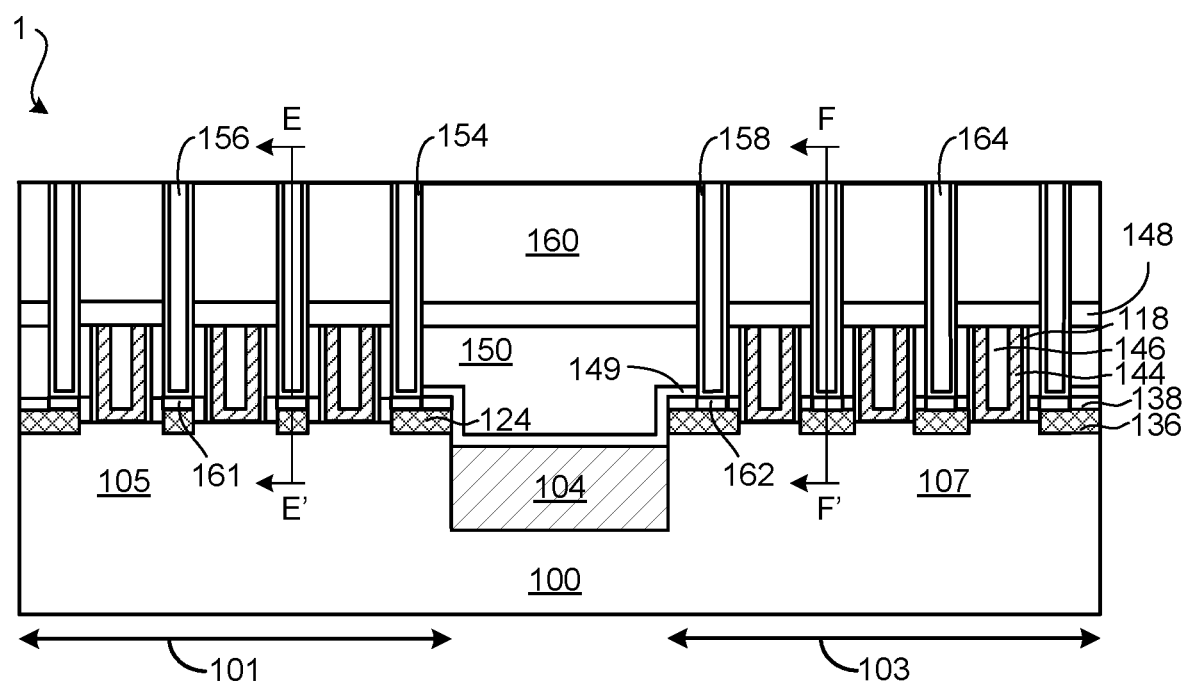
Figure 1C:
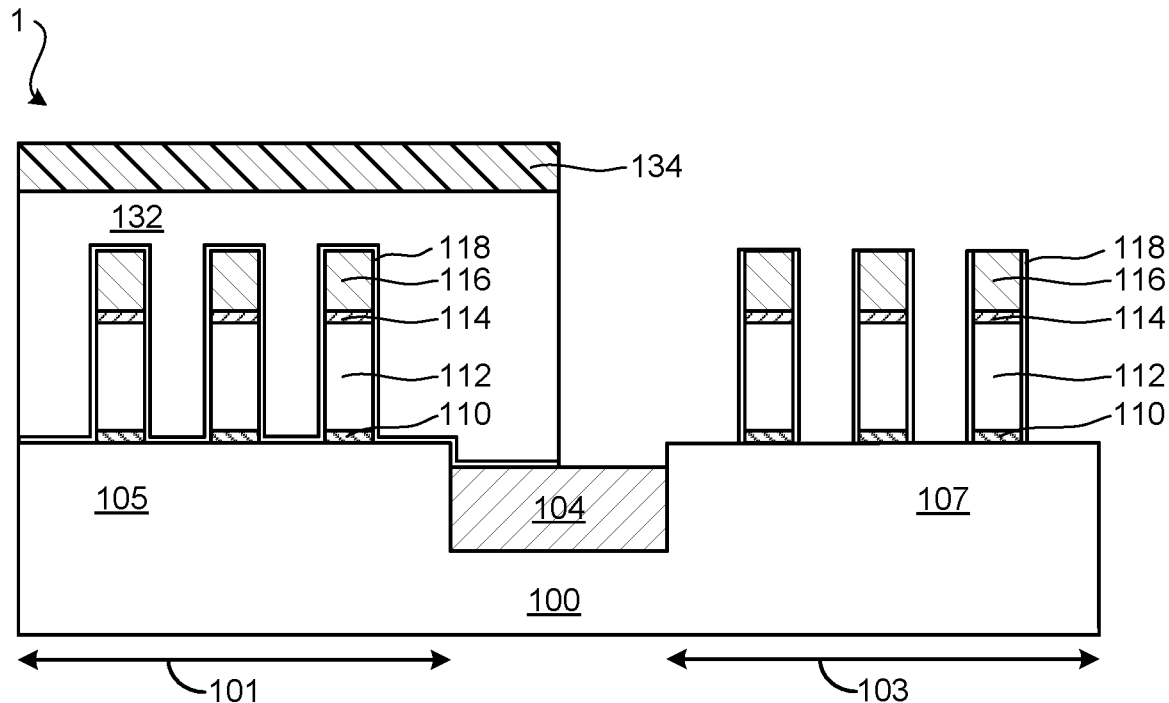
Figure 1D:
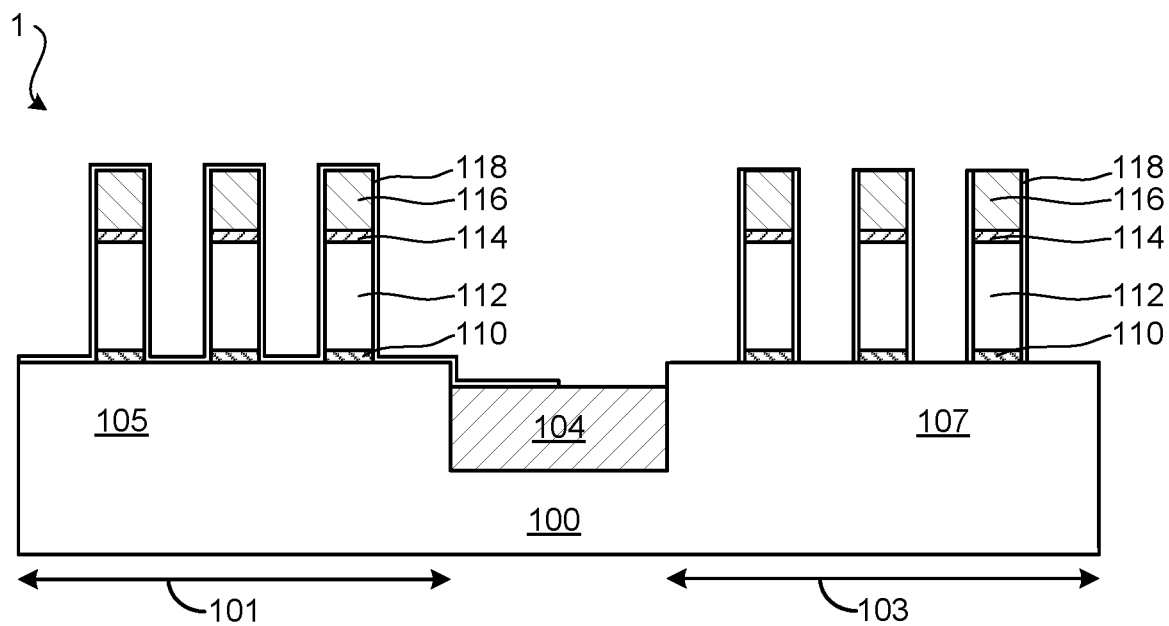

FIG. 1B shows a low-k gate spacer layer 118 that is conformally deposited on the substrate 1, where the low-k gate spacer layer 118 can, for example, include SiCO or SiBCN materials. FIG. 1C shows an organic layer 132 that is deposited and patterned using a patterned photoresist layer 134 to cover the NFET region 101. In some examples, the organic layer 132 can include an organic planarization layer (OPL) or an organic dielectric layer (ODL). FIG. 1C further shows the substrate 1 following a reactive ion etching process (RIE) that removes horizontal portions of the low-k gate spacer layer 118 in the PFET region 103, while the low-k spacer layer 118 in the NFET region 101 is protected from the RIE by the organic layer 132. The remaining vertical portions of the low-k gate spacer layer 118 form sidewall spacers on the patterned film stacks in the PFET region 103. FIG. 1D shows the substrate 1 following removal of the organic layer 132 and the patterned photoresist layer 134 from the NFET region 101.

Figure 1E:
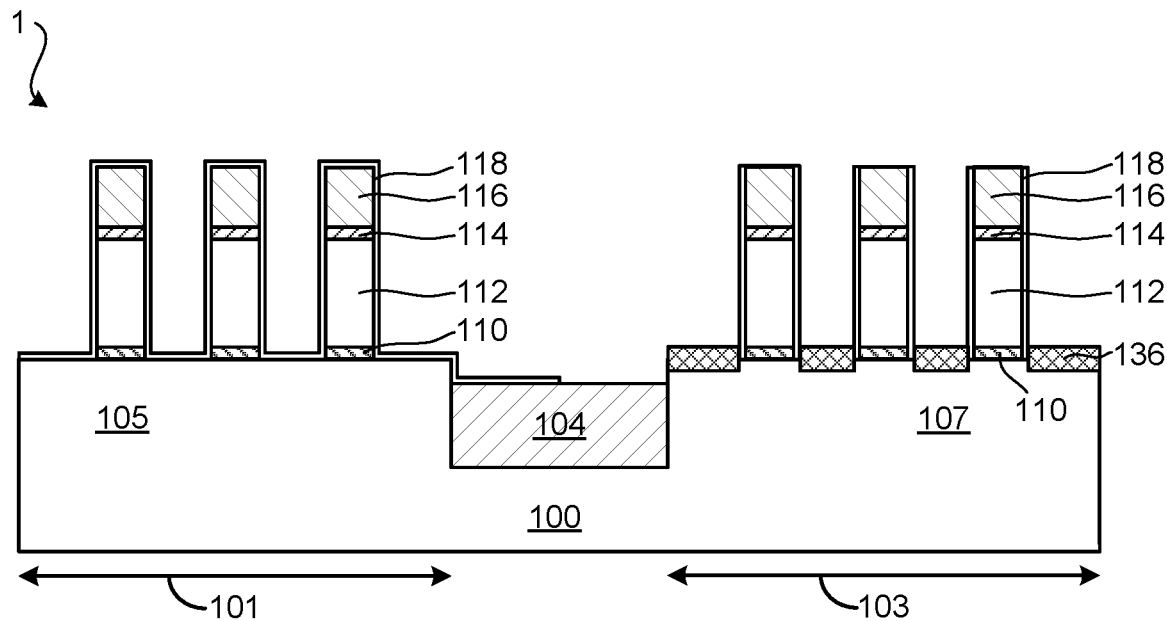

FIG. 1E shows the substrate 1 following selective deposition of a second p-type doped epitaxial semiconductor material 136 on exposed surfaces of the second raised feature 107 (e.g., Si fin) in the PFET region 103. The second p-type doped epitaxial semiconductor material 136 can, for example, contain p-type Si that includes boron-doped silicon (Si:B) or p-type silicon germanium that includes boron-doped silicon germanium (SiGe:B). The selective epitaxial deposition results in the second p-type doped epitaxial semiconductor material 136 being faceted and wrapping around the second raised feature 107, where the second p-type doped epitaxial semiconductor material 136 has upward facing surfaces and downward facing surfaces. Si:B may be selectively deposited using SiH$_4$, Si$_2$H$_6$, or SiH$_2$Cl$_2$ and BH$_3$ or B$_2$H$_6$. SiGe:B may be selectively deposited using SiH$_4$, Si$_2$H$_6$, or Si$_2$H$_2$Cl$_2$ and GeH$_4$ and BH$_3$ or B$_2$H$_6$.

Figure 1F:
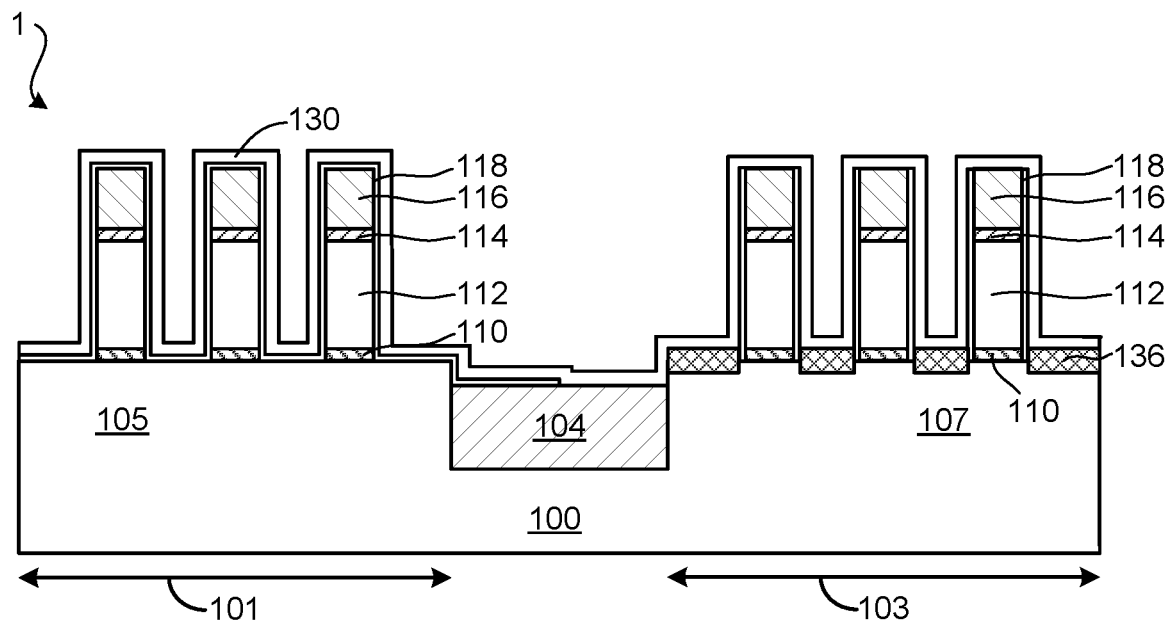
Figure 1G:
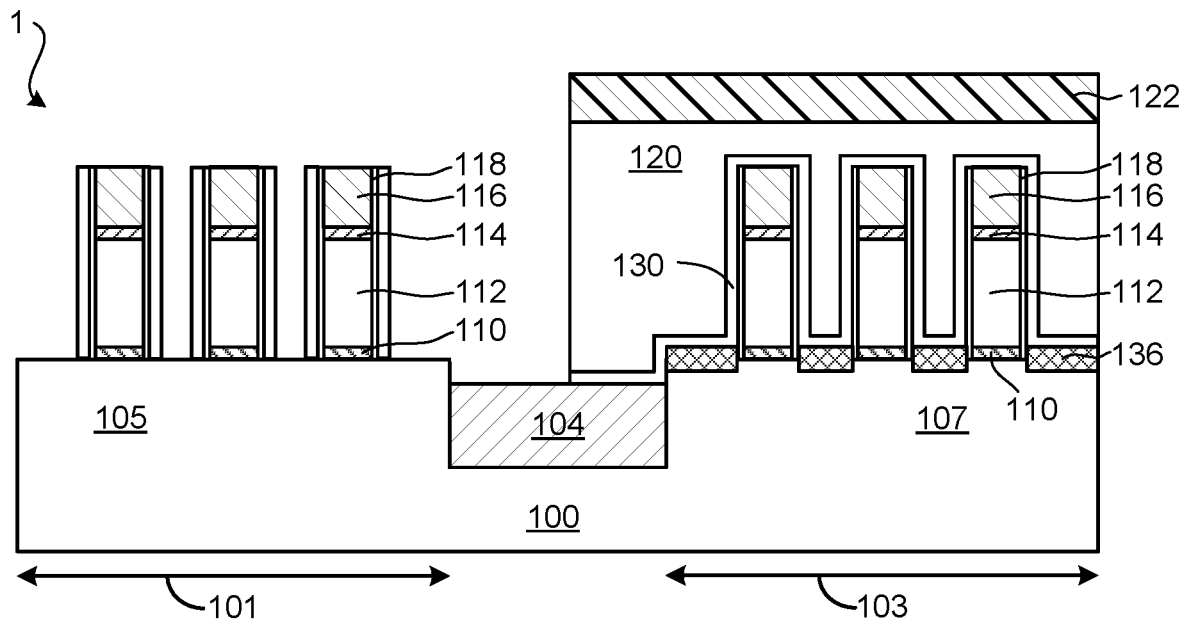
Figure 1H:
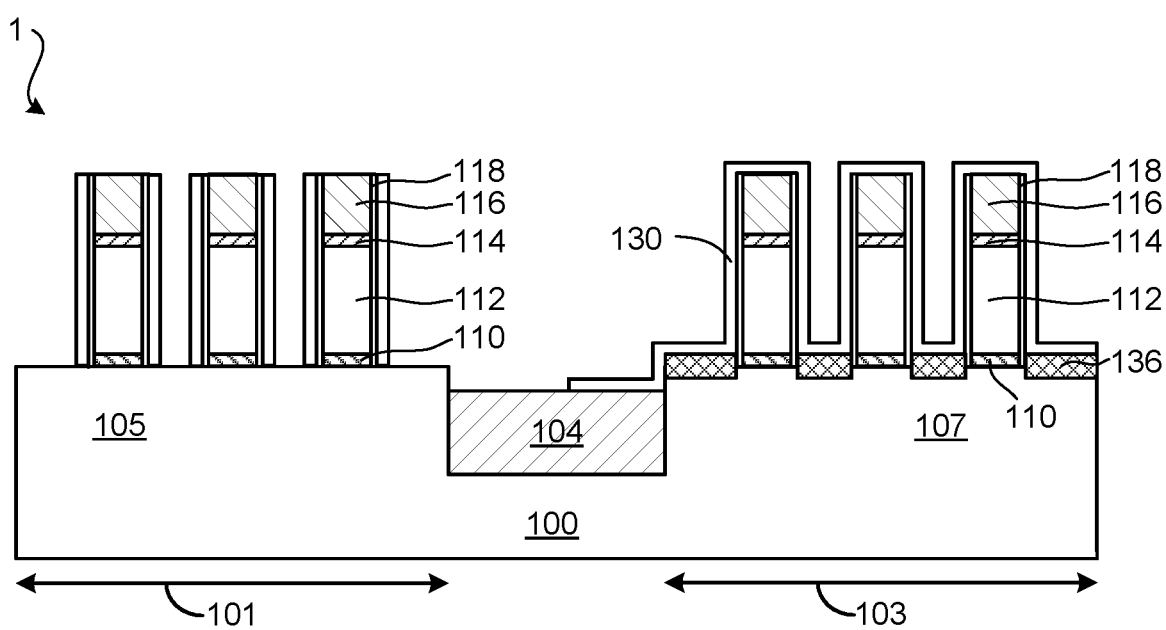

FIG. 1F shows the substrate 1 following conformal deposition of a SiN liner 130 over the raised and recessed features of the substrate 1, and FIG. 1G shows an organic layer 120 that is patterned to cover the PFET region 103 using a patterned photoresist layer 122. In some examples, the organic layer 120 can include an OPL or an ODL. FIG. 1G further shows the substrate 1 following a RIE that removes horizontal portions of the SiN liner 130 in the NFET region 101, while the SiN liner 130 in the PFET region 103 is protected from the RIE. The remaining vertical portions of the SiN liner 130 form sidewall spacers on the patterned film stacks in the NFET region 101. FIG. 1H shows the substrate 1 following removal of the organic layer 120 and the patterned photoresist layer 122 from the PFET region 103.

Figure 1I:
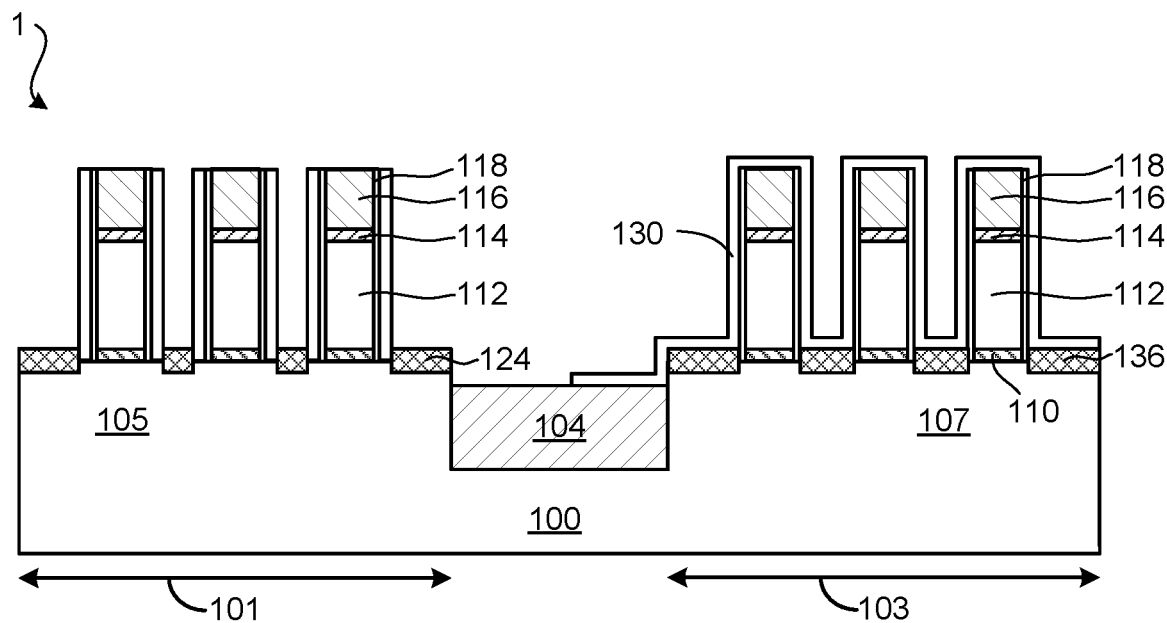

FIG. 1I shows the substrate 1 following selective deposition of a first n-type doped epitaxial semiconductor material 124 on exposed surfaces of the first raised feature 105 (e.g., Si fin) in the NFET region 101. The first n-type doped epitaxial semiconductor material 124 can, for example, contain n-type Si that includes phosphor-doped silicon (Si:P) or arsenic-doped silicon (Si:As). The selective epitaxial deposition results in the first doped epitaxial semiconductor material 124 wrapping around the first raised feature 105, where the first n-type doped epitaxial semiconductor material 124 has upward facing surfaces and downward facing surfaces. Si:P may be selectively deposited using SiH$_4$, Si$_2$H$_6$, or SiH$_2$Cl$_2$ and PH$_3$. Si:As may be selectively deposited using SiH$_4$, Si$_2$H$_6$ or SiH$_2$Cl$_2$ and AsH$_3$. Exemplary substrate temperatures can range from about 400° C. to about 800° C.

Figure 1J:
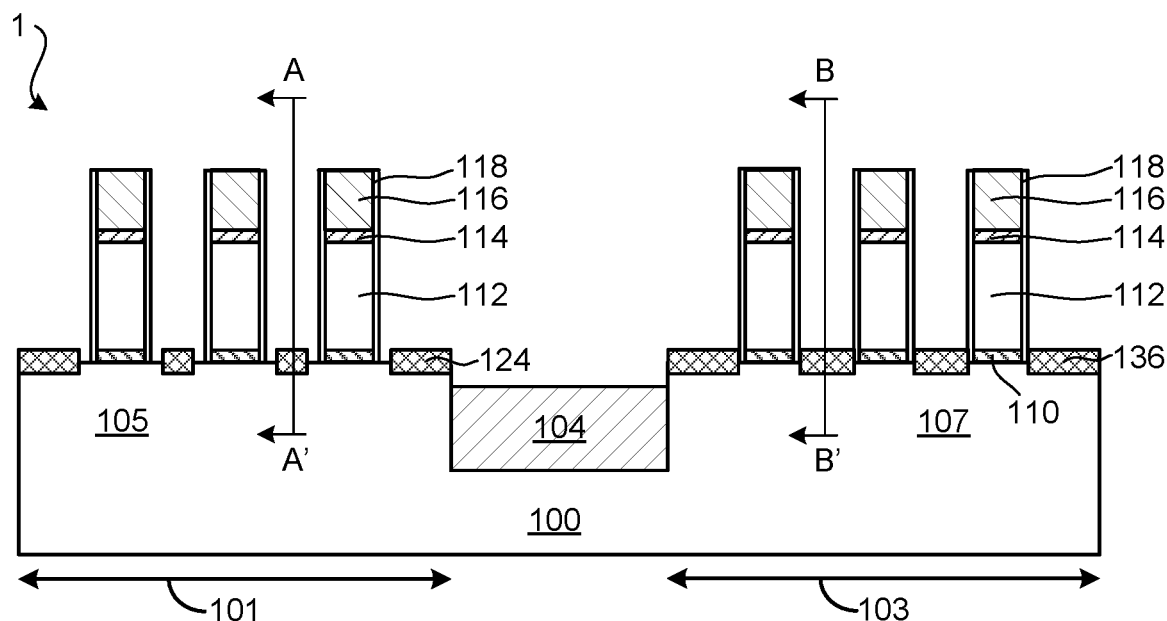
Figure 2A:
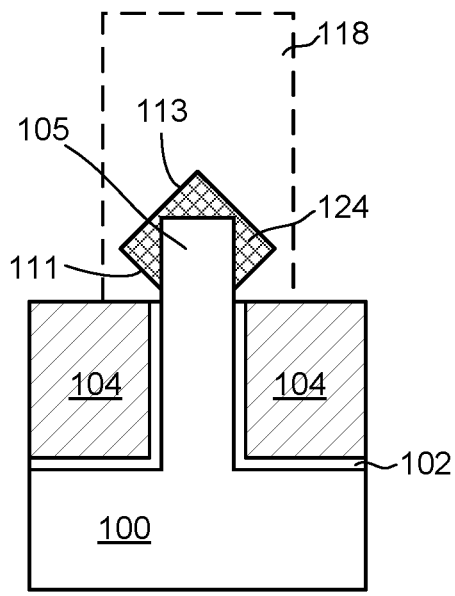
FIGS. 2A-2C schematically show through cross-sectional views a method of forming a semiconductor device containing dual metal wrap-around contacts according to an embodiment of the invention.
Figure 3A:
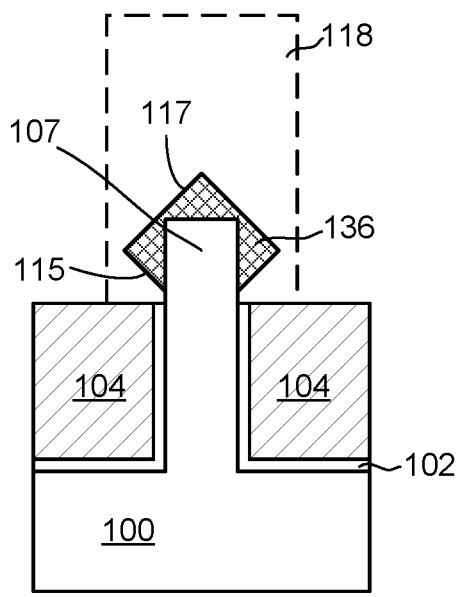
FIGS. 3A-3C schematically show through cross-sectional views a method of forming a semiconductor device containing dual wrap-around contacts according to an embodiment of the invention.

FIG. 1J shows the substrate 1 following removal of the SiN liner 130 from the substrate 1. FIG. 2A shows a cross-sectional view along the line A-A' of FIG. 1J that includes a first downward facing surface 111 and a first upward facing surface 113 of the first n-type doped epitaxial semiconductor material 124. Similarly, FIG. 3A shows a cross-sectional view along the line B-B' of FIG. 1J that includes a second downward facing surface 115 and a second upward facing surface 117 of the second p-type doped epitaxial semiconductor material 136. A liner 102 separates the STI 104 from the first raised feature 105 and from the second raised feature 107.

Figure 1K:
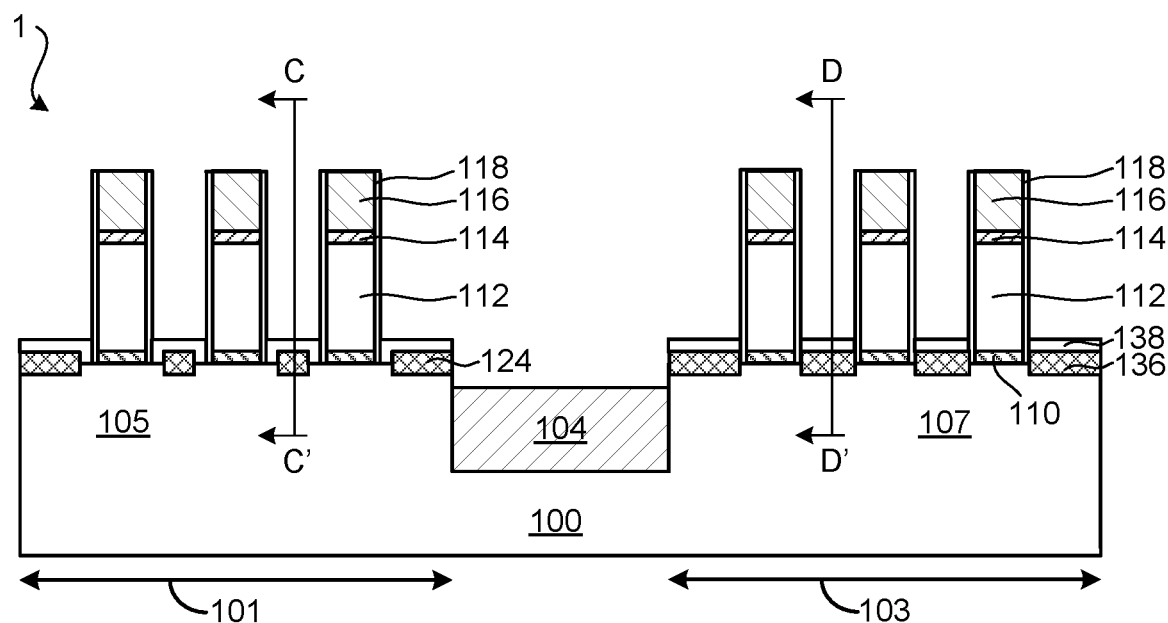
Figure 2B:
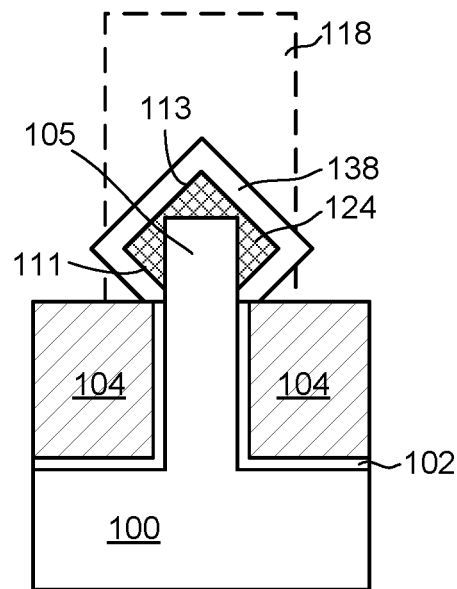
Figure 3B:
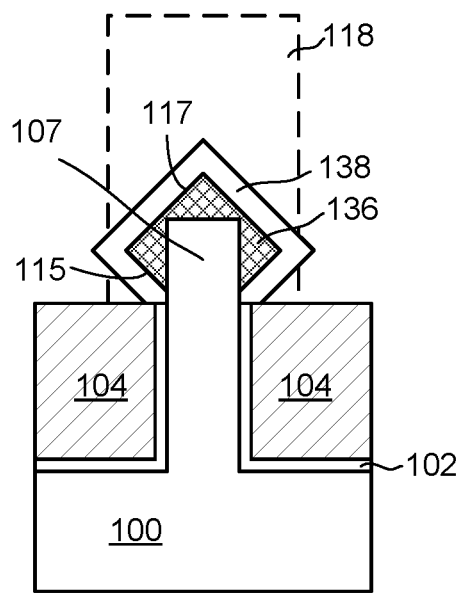

FIG. 1K shows the substrate 1 following deposition of a first metal layer 138 on the first n-type epitaxial semiconductor material 124 and on the second p-type doped epitaxial semiconductor material 136. In one example, the first metal layer 38 can include titanium (Ti) metal or ruthenium (Ru) metal. Ti metal deposition can be achieved using TiCl$_4$ gas flow and pulsed RF plasma. Ru metal deposition can be achieved using a process gas containing Ru$_3$(CO)$_{12}$ and CO. The first metal layer 138 wraps around the first n-type doped epitaxial semiconductor material 124 and the second p-type doped epitaxial semiconductor material 136. FIG. 2B shows a cross-sectional view along the line C-C' of FIG. 1K that includes the first metal layer 138 on the first downward facing surface 111 and on the first upward facing surface 113 of the first n-type doped epitaxial semiconductor material 124. Similarly, FIG. 3B shows a cross-sectional view along the line D-D' of FIG. 1K that includes the first metal layer 138 on the second downward facing surface 115 and on the second upward facing surface 117 of the second p-type doped epitaxial semiconductor material 136.

Figure 1L:
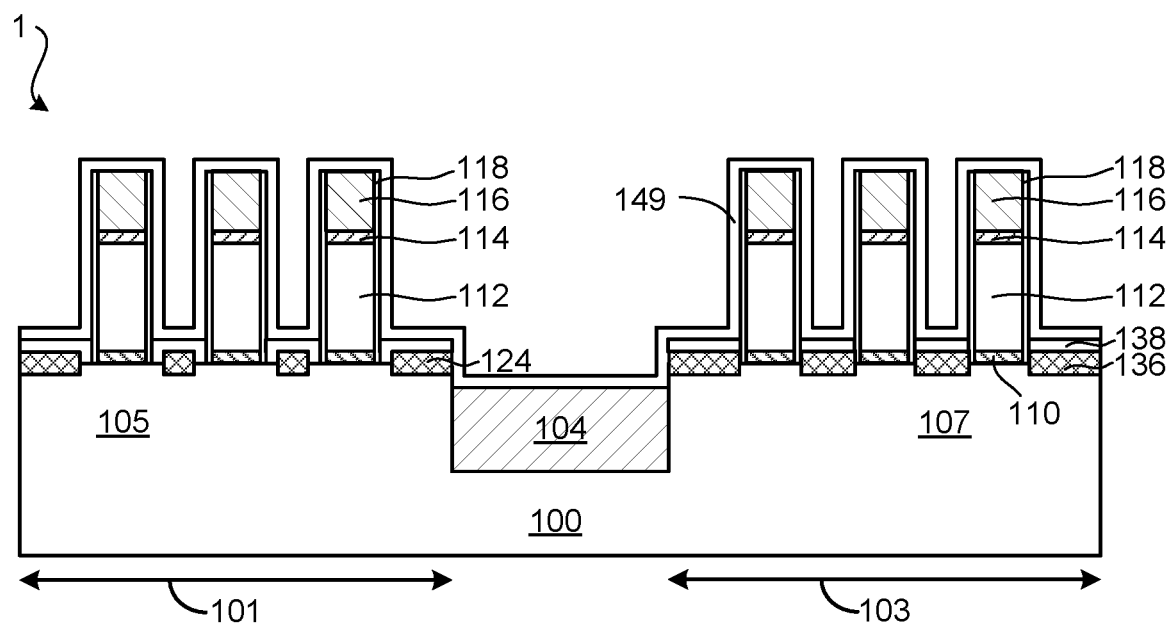
Figure 1M:
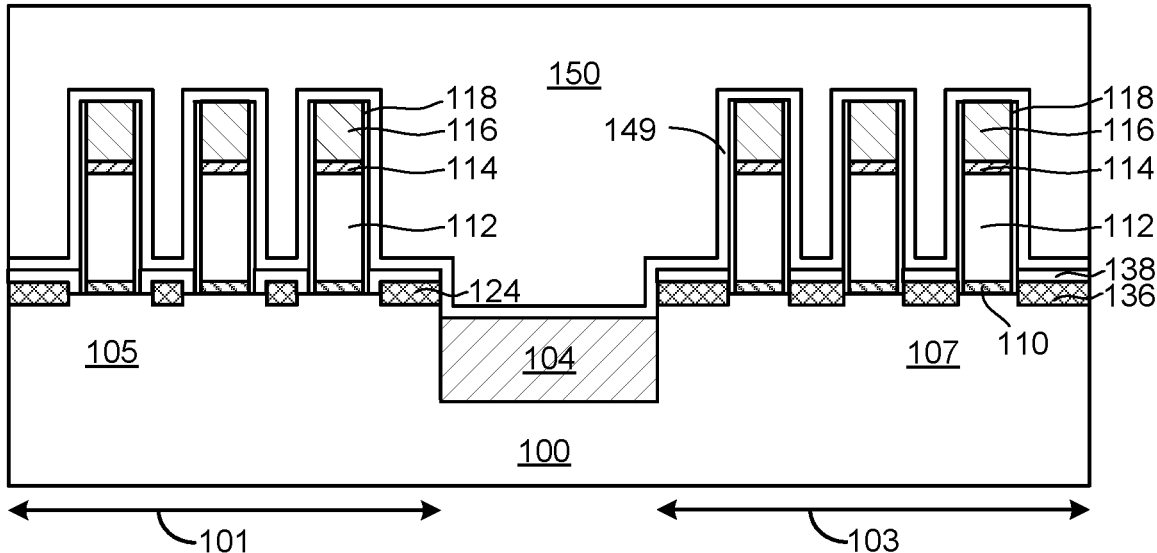
Figure 1N:
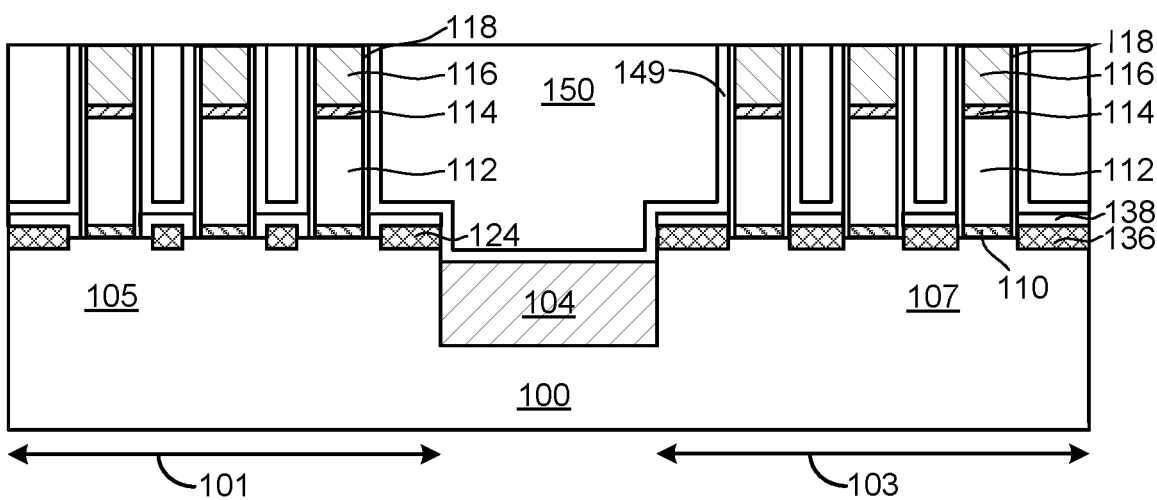

FIG. 1L shows the substrate 1 following conformal deposition of a SiN liner 149 over the raised and recessed features of the substrate 1, and FIG. 1M shows the substrate 1 following blanket deposition of a gap-fill oxide film 150, were the gap-fill oxide film 150 may be deposited using a flowable oxide and a SiH$_4$-based oxide, for example. FIG. 1N shows the substrate 1 following a planarization process that stops on the SiN hard mask 116. In one example, the planarization process can include chemical mechanical polishing (CMP).

Figure 1O:
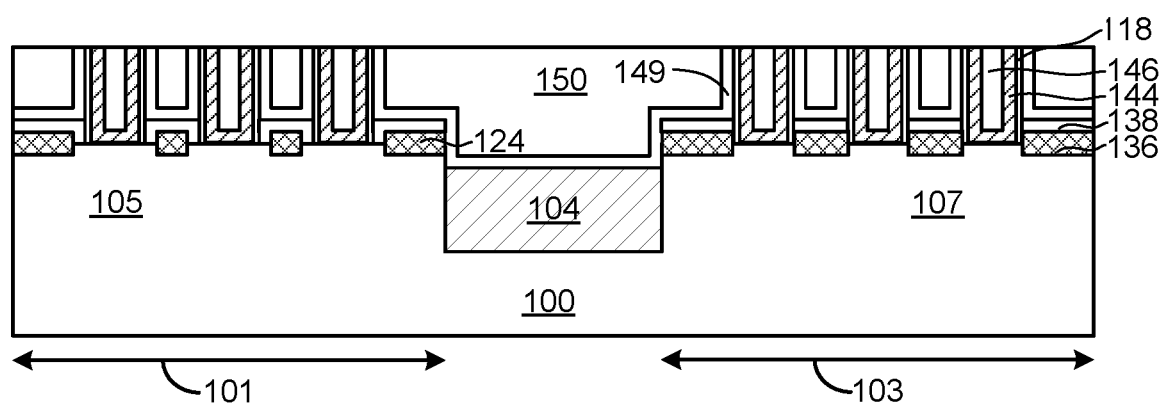
Figure 1P:
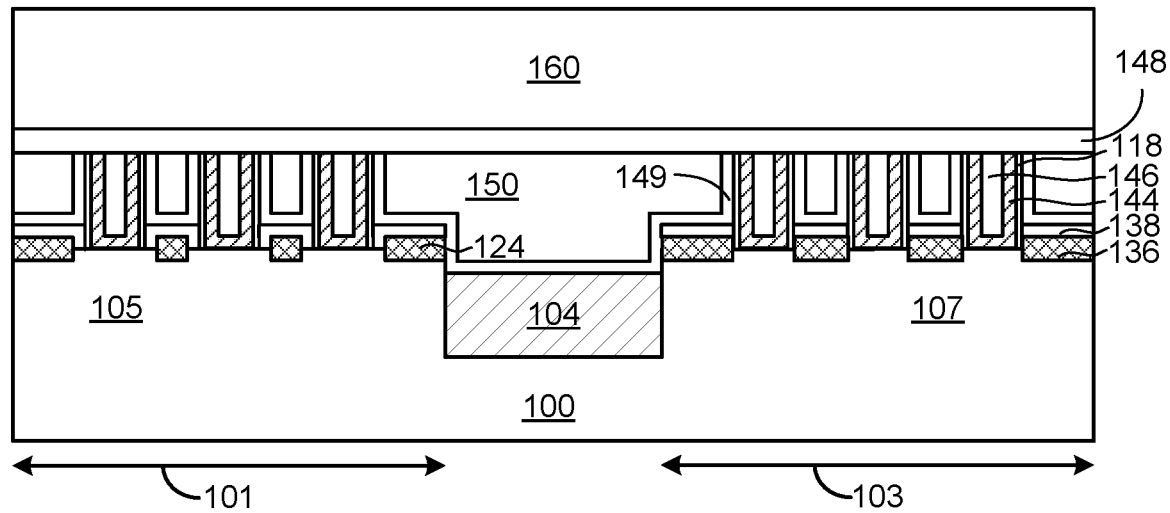
Figure 1Q:
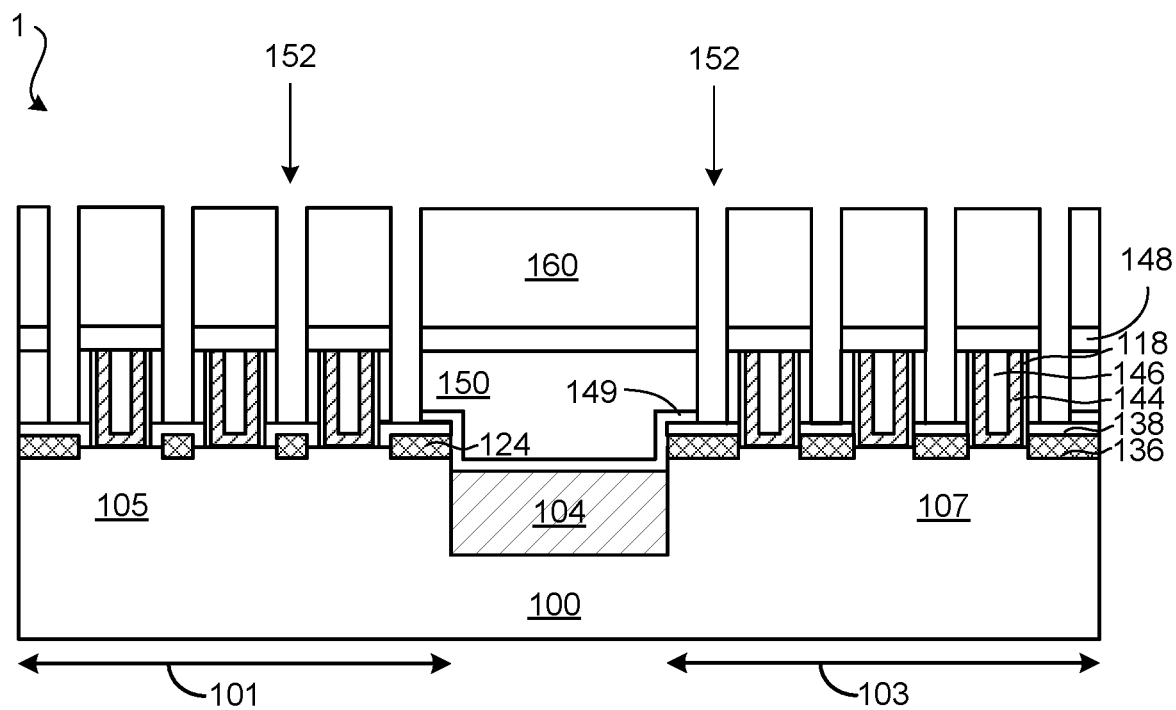
Figure 1R:
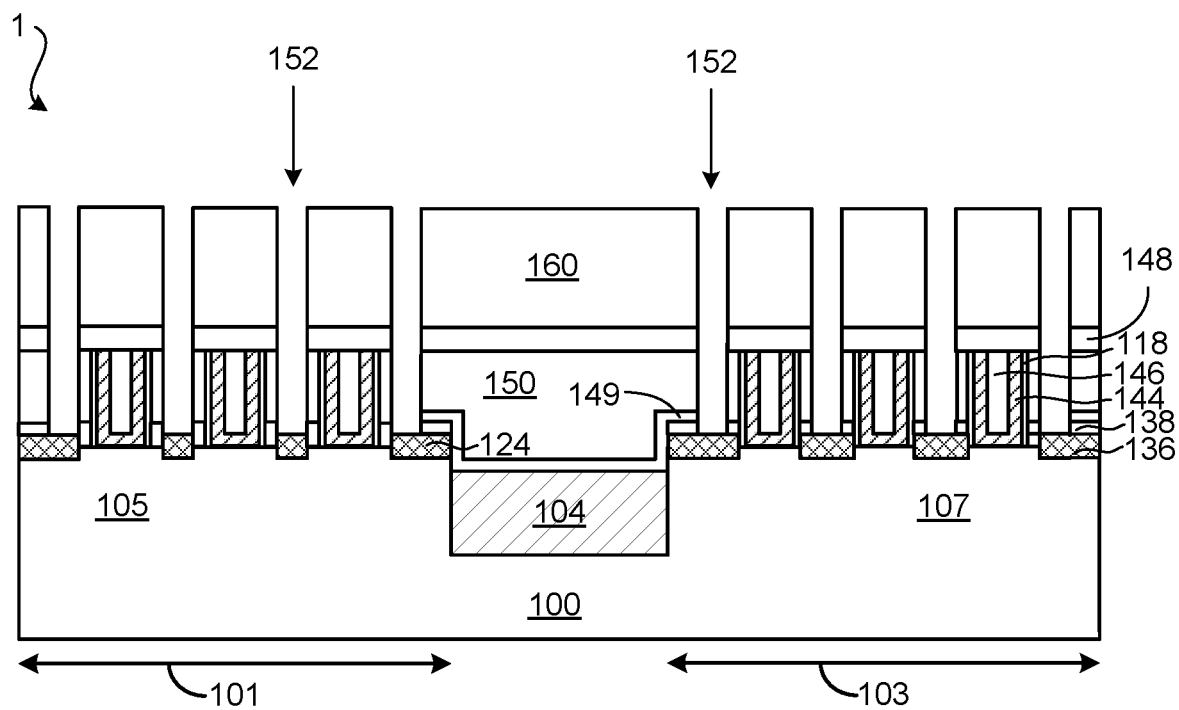

FIG. 1O shows the substrate 1 following removal of the patterned film stacks and replacement with a high-k layer 144 and a metal gate layer 146. FIG. 1P shows the substrate 1 following deposition of a SiN liner 148 and an interlayer dielectric (ILD) 160 on the SiN liner 148. Thereafter, as shown in FIG. 1Q, a self-aligned contact etching process is performed to form recessed features 152 down to the first metal layer 138 in the NFET region 101 and the PFET region 103. FIG. 1R shows the substrate following an etching process that etches through the first metal layer 138 and stops on the first n-type doped epitaxial semiconductor material 124 and the second p-type doped epitaxial semiconductor material 136.

Figure 1S:
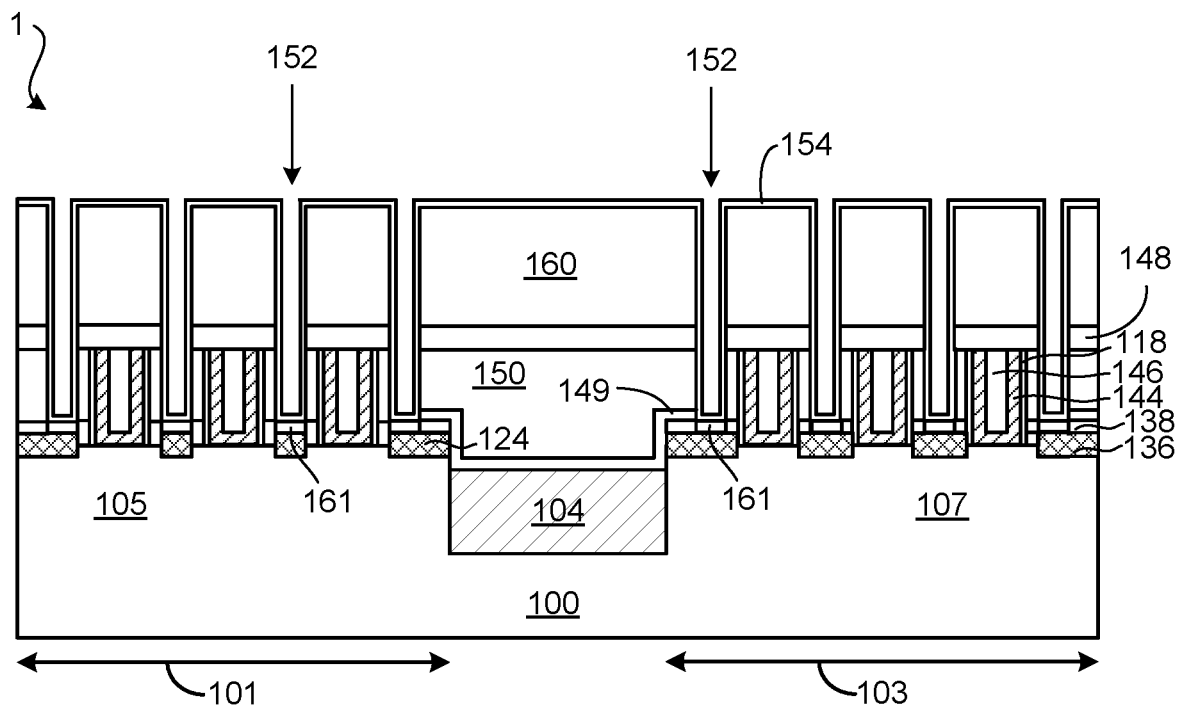
Figure 1T:
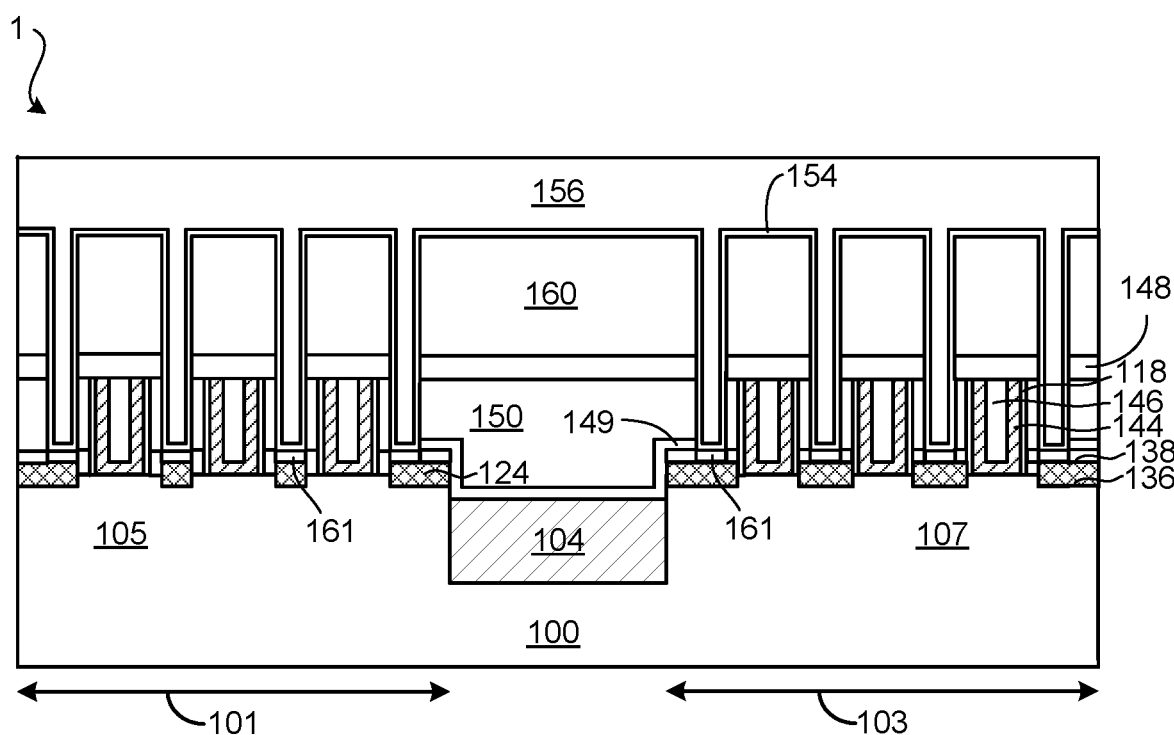
Figure 1U:
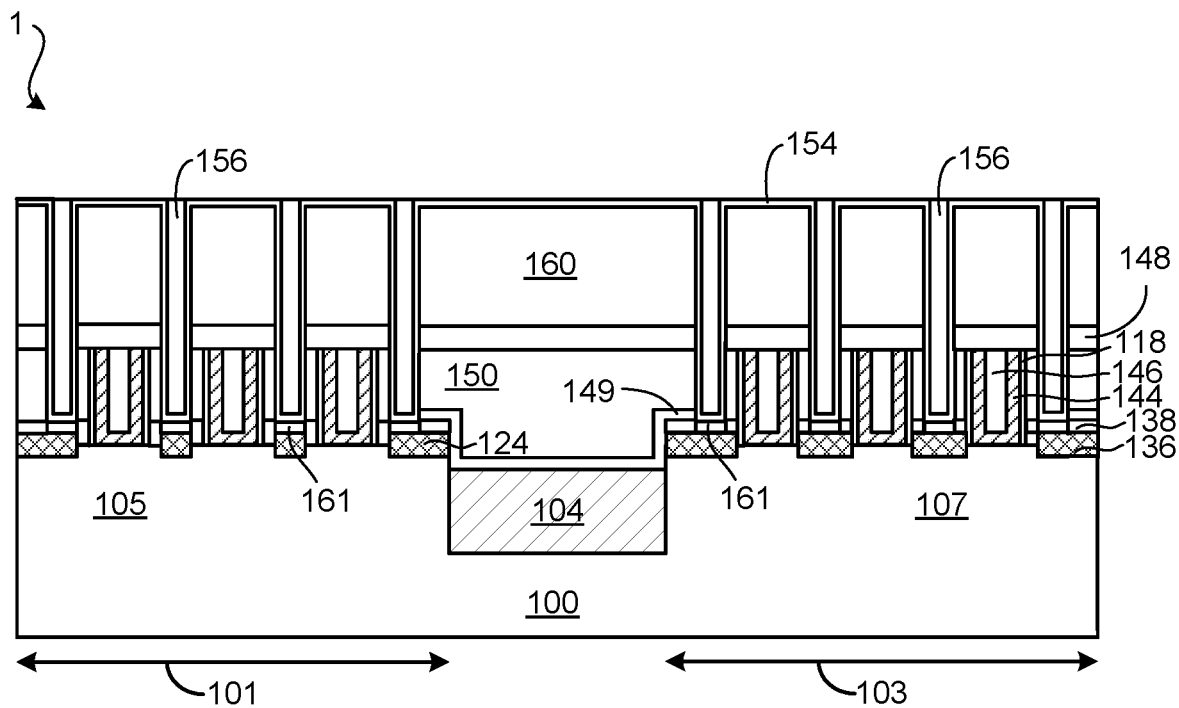

Thereafter, as shown in FIG. 1S, a second metal layer 161 (e.g., a Ti layer) is deposited in the recessed features 152 and a titanium nitride (TiN) layer 154 is conformally deposited on the substrate 1, including in the recessed features 152. In some examples, the second metal layer 161 may be annealed to react to form a metal silicide (e.g., TiSi$_x$). In one example, the TiN layer 154 can have a thickness of less than about 3 nm. FIG. 1T shows the substrate 1 following blanket deposition of a tungsten (W) metal layer 156 that fills the recess features 152. Thereafter, as shown in FIG. 1U, the W metal layer 156 is planarized down to the TiN layer 154.

Figure 1V:
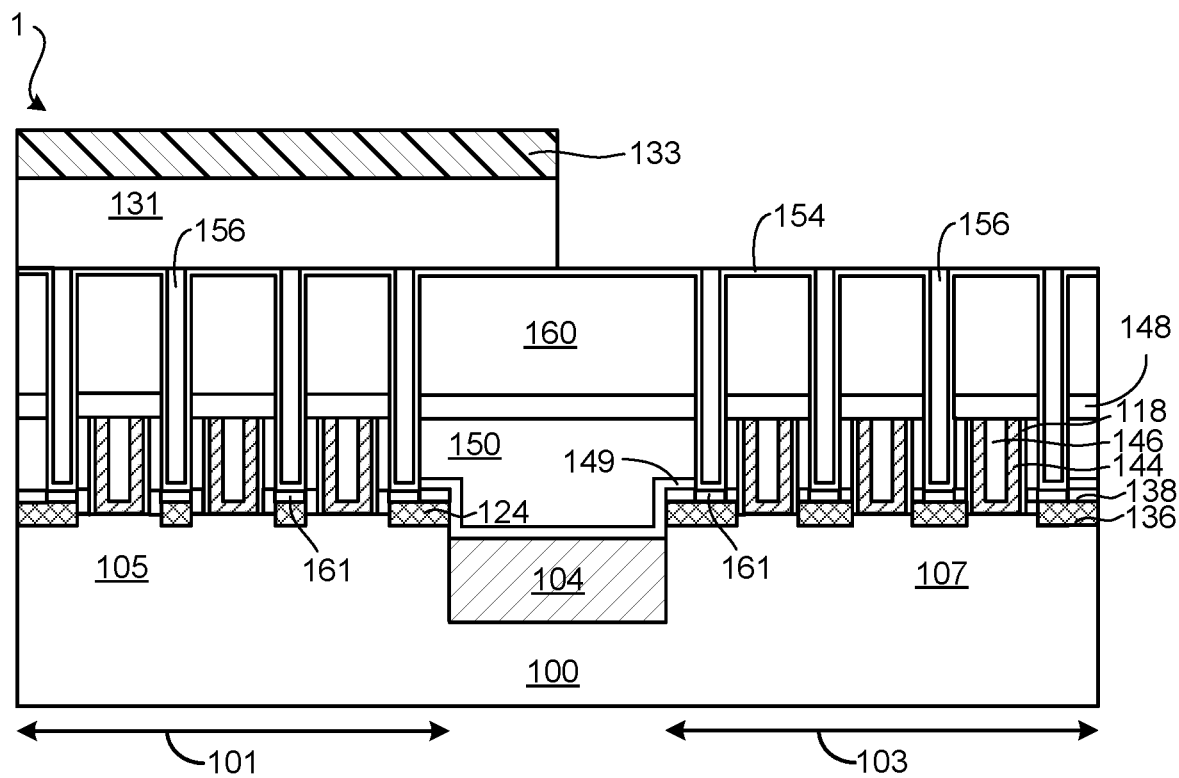
Figure 1W:
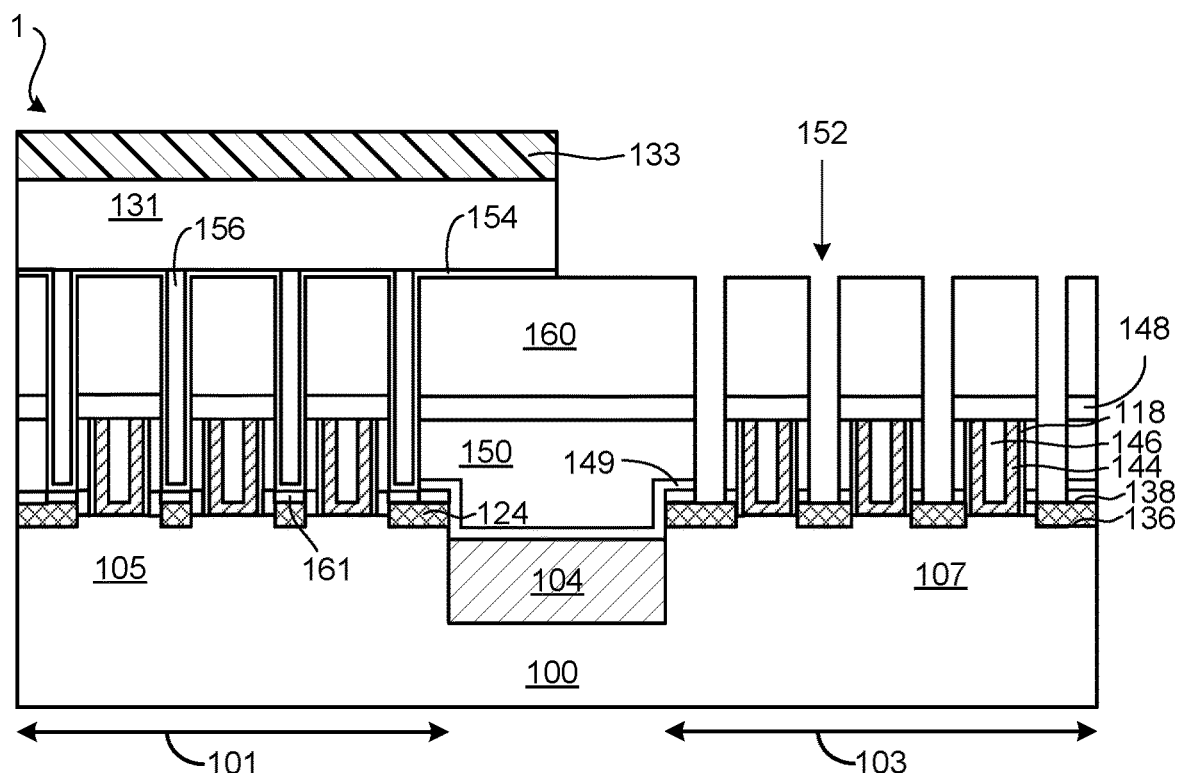
Figure 1X:
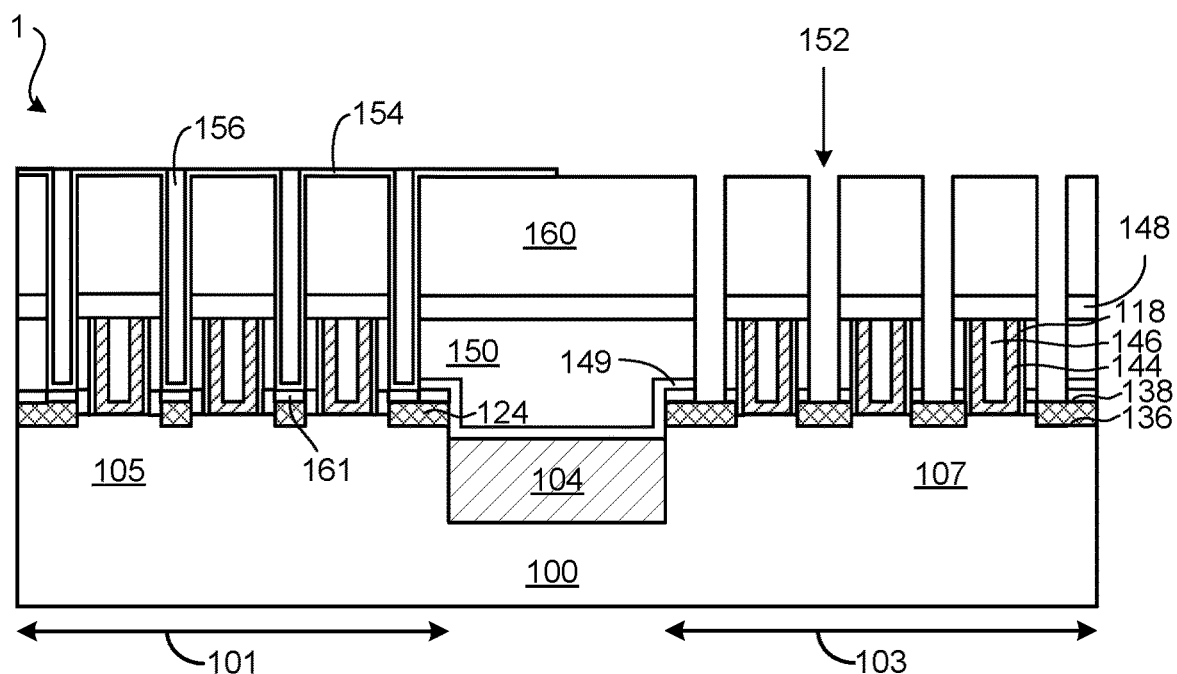

FIG. 1V shows an organic layer 131 that is deposited and patterned to cover the NFET region 101 using a patterned photoresist layer 133. In some examples, the organic layer 131 can include an OPL or an ODL. FIG. 1W further shows the substrate 1 following a RIE process that removes the TiN layer 154, the W metal layer 156, and the second metal layer 161 from the PFET region 103, while the TiN layer 154, the W metal layer 156, and the second metal layer 161 in the NFET region 101 are protected from the RIE by the organic layer 131. FIG. 1X shows the substrate 1 following removal of the organic layer 131 and the patterned photoresist layer 133 from the NFET region 101.

Figure 1Y:
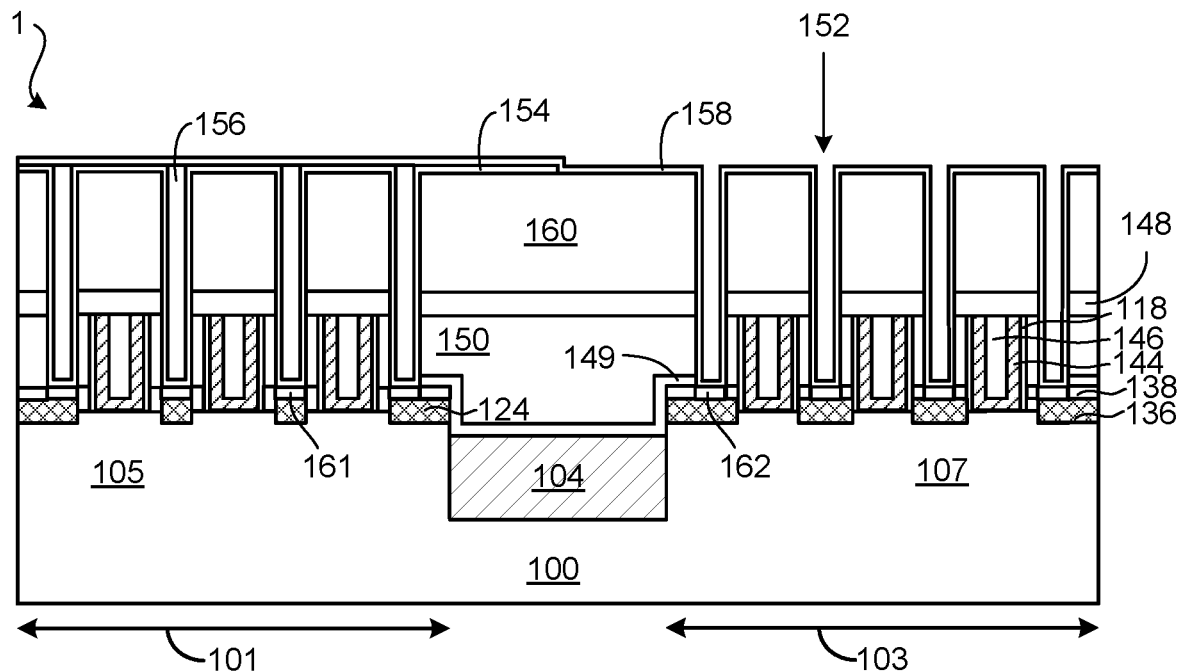
Figure 1Z:
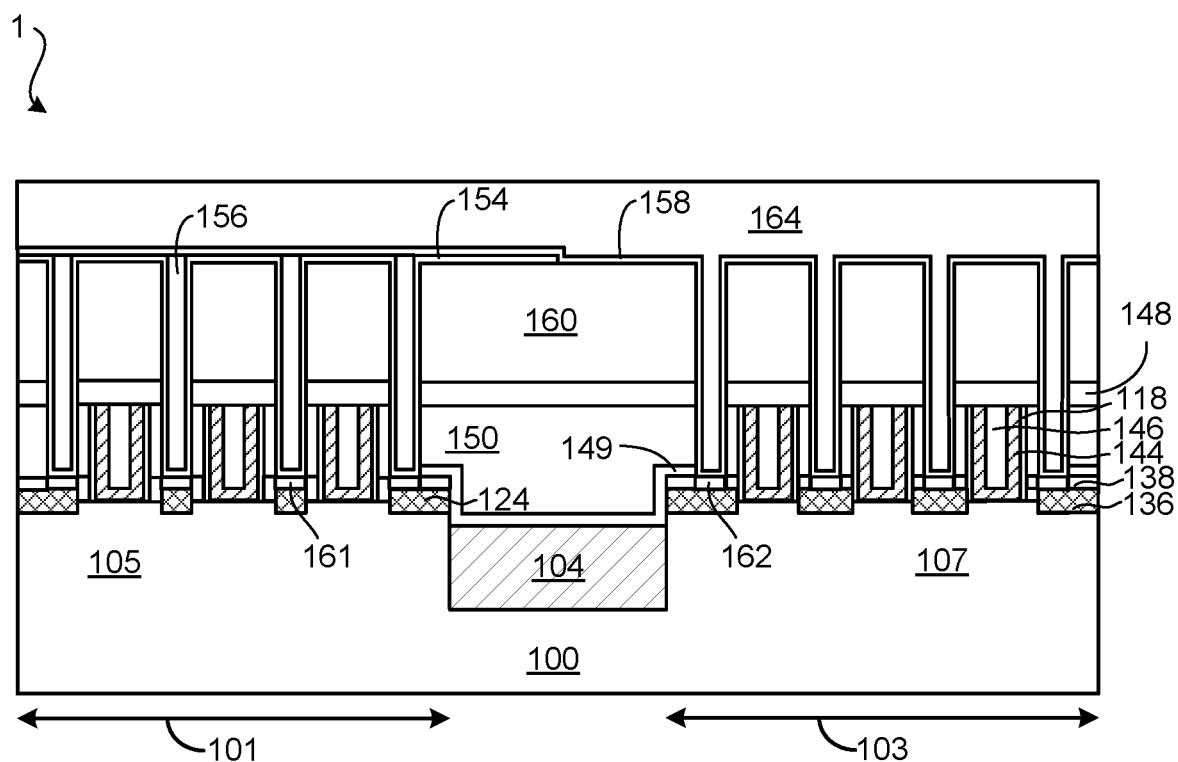

FIG. 1Y shows the substrate 1 following selective deposition of a third metal layer 162 on the second p-type doped epitaxial semiconductor material 136 in the recessed features 152 and a blanked deposition of a TiN layer 158. In some examples, the third metal layer 162 can include ruthenium (Ru) metal or nickel platinum (NiPt). FIG. 1Z shows the substrate 1 following blanket deposition a W metal layer 164 that fills the recessed features 152 in the PFET region 103.

Figure 2C:
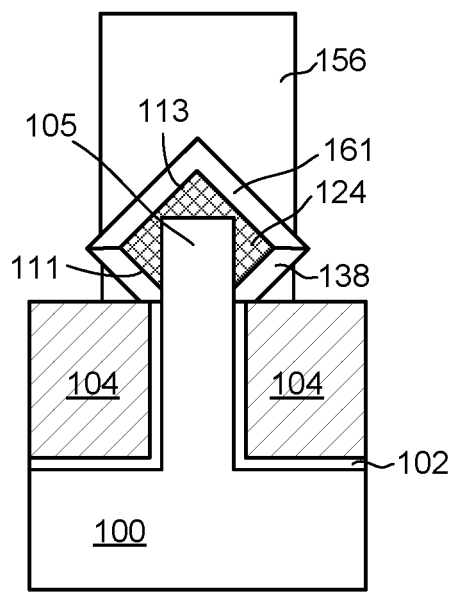
Figure 3C:
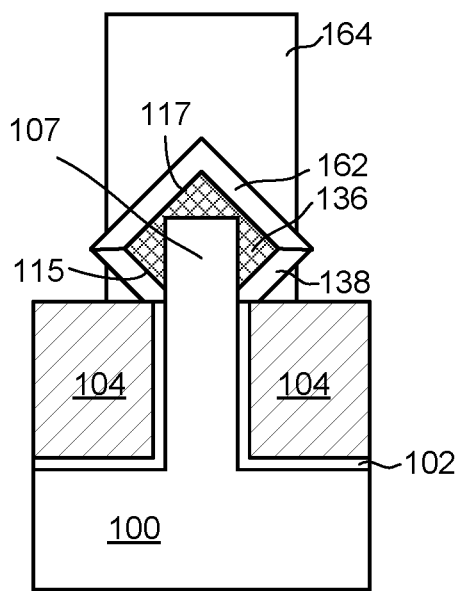

Thereafter, as shown in FIG. 1AA, the W metal layer 164 is planarized down to the TiN layer 154. FIG. 2C shows a cross-sectional view along the line E-E' of FIG. 1AA that includes the first metal layer 138 (first contact metal) on the first downward facing surface 111 and the second metal layer 161 (second contact metal) on the first upward facing surface 113. Similarly, FIG. 3C shows a cross-sectional view along the line F-F' of FIG. 1AA that includes the first metal layer 138 (third contact metal) on the second downward facing surface 115 and the third metal layer 162 (fourth contact metal) on the second upward facing surface 117.

Figure 4A:
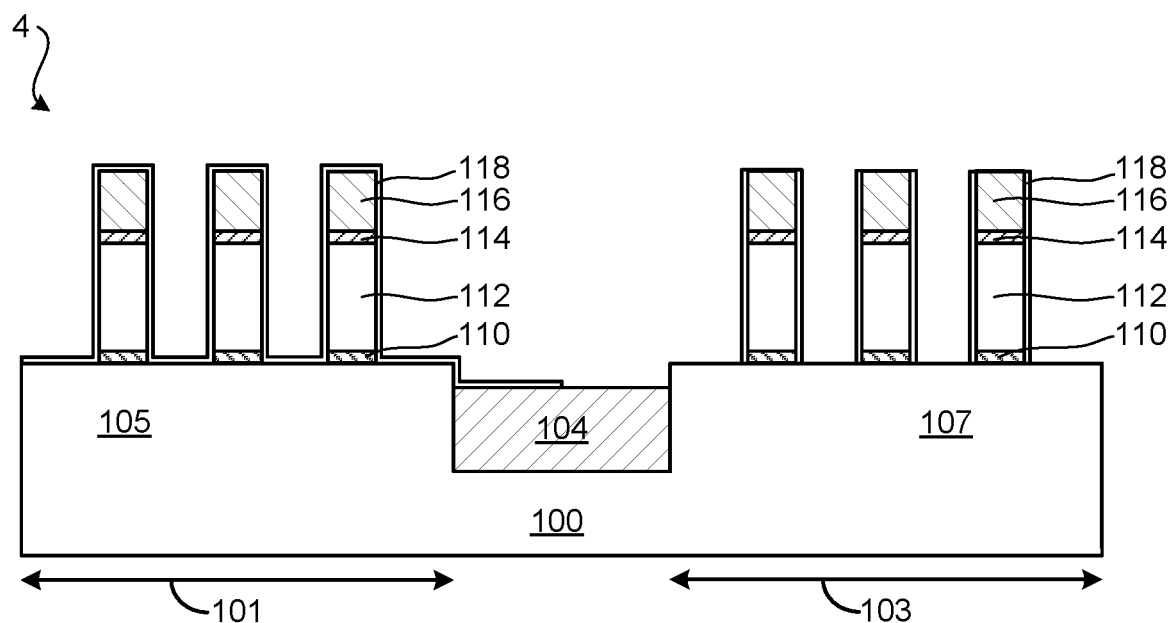
FIGS. 4A-4Y schematically show through cross-sectional views a method of forming a semiconductor device containing dual metal wrap-around contacts according to an embodiment of the invention.
Figure 4B:
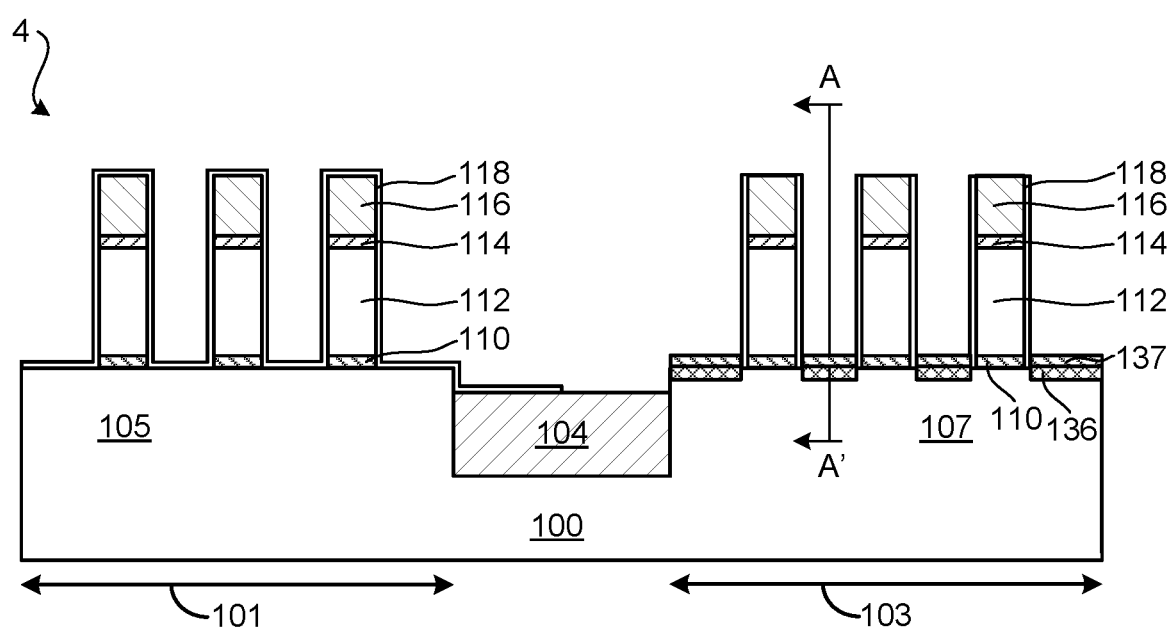
Figure 4C:
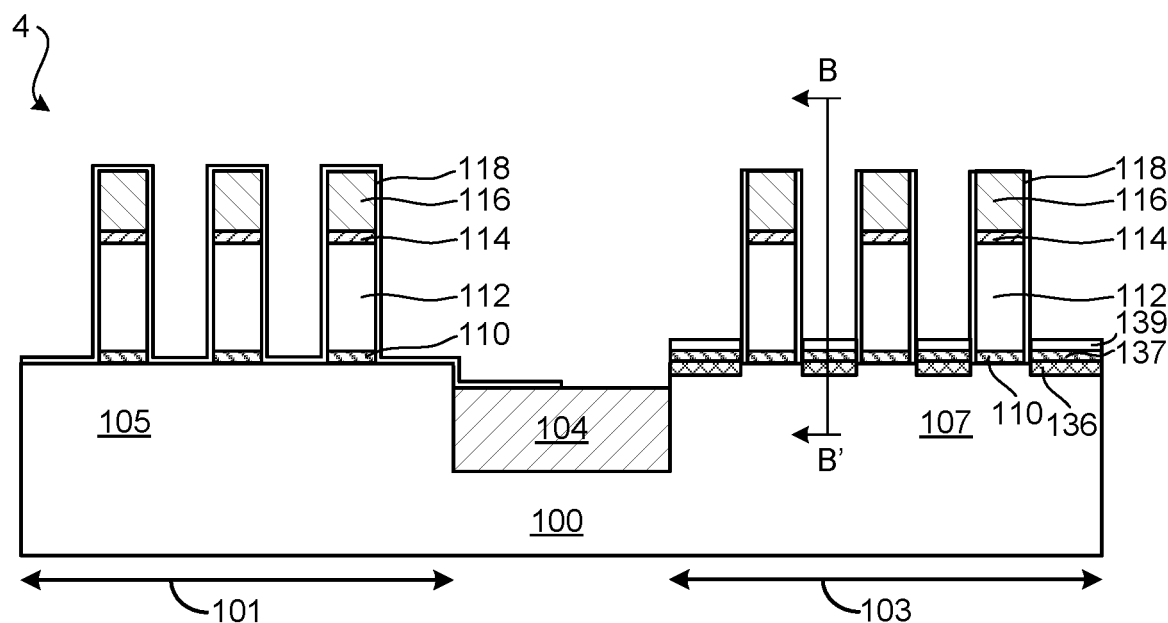
Figure 4D:
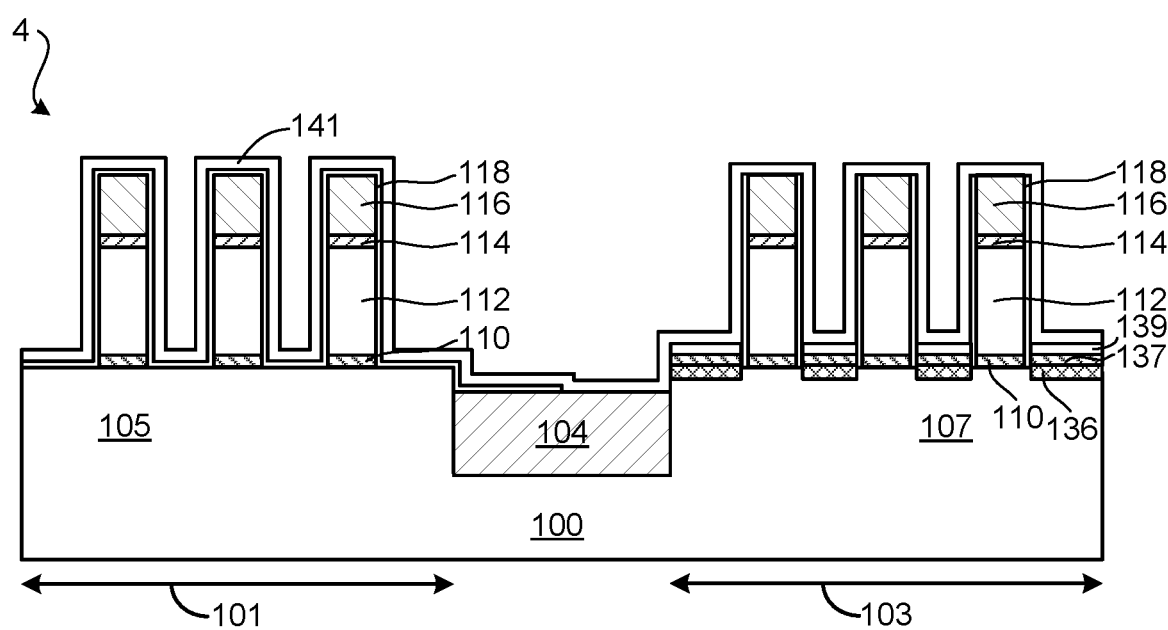
Figure 4E:
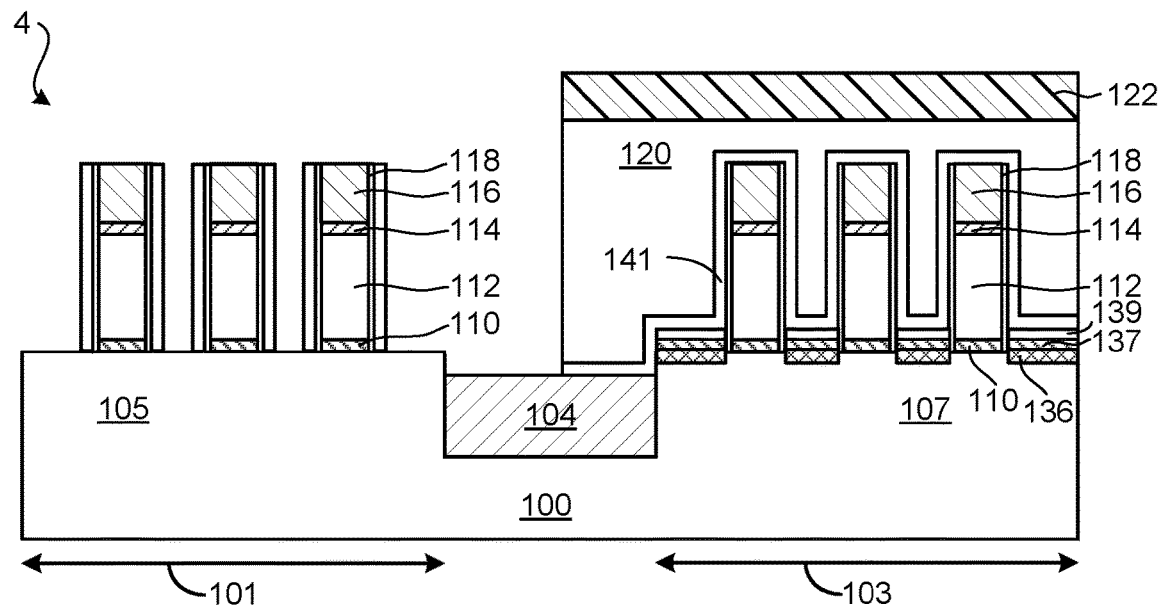
Figure 4F:
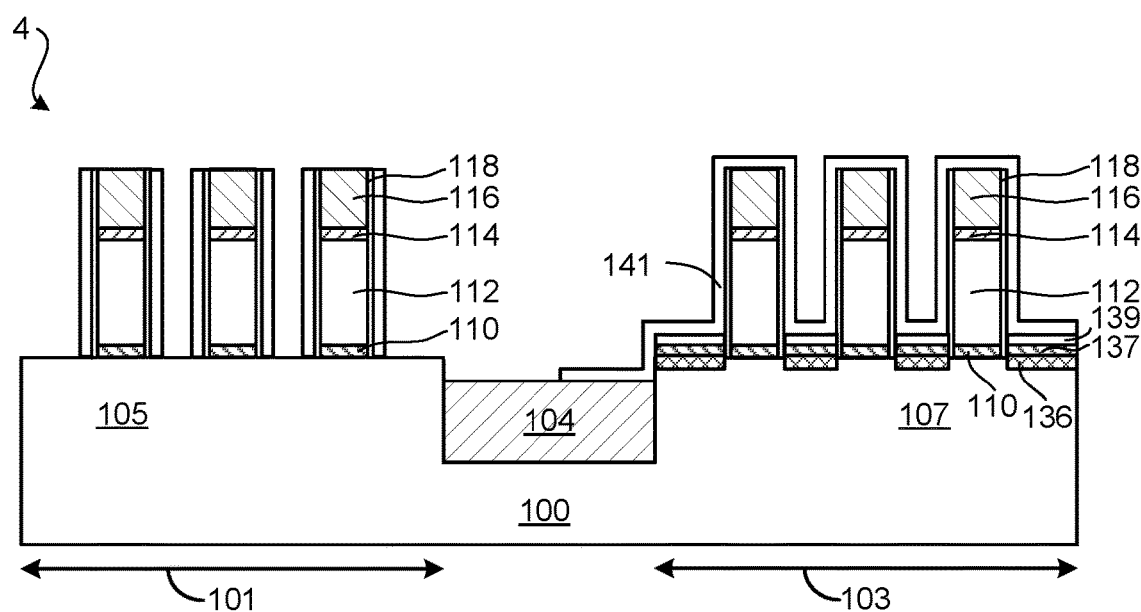
Figure 4G:
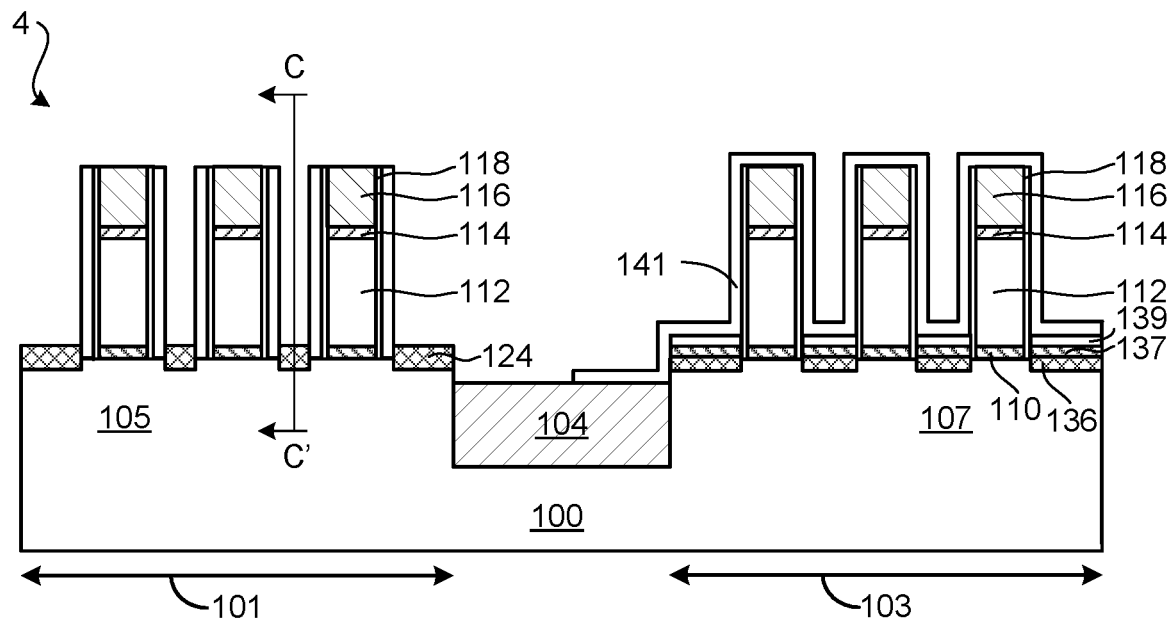
Figure 4H:
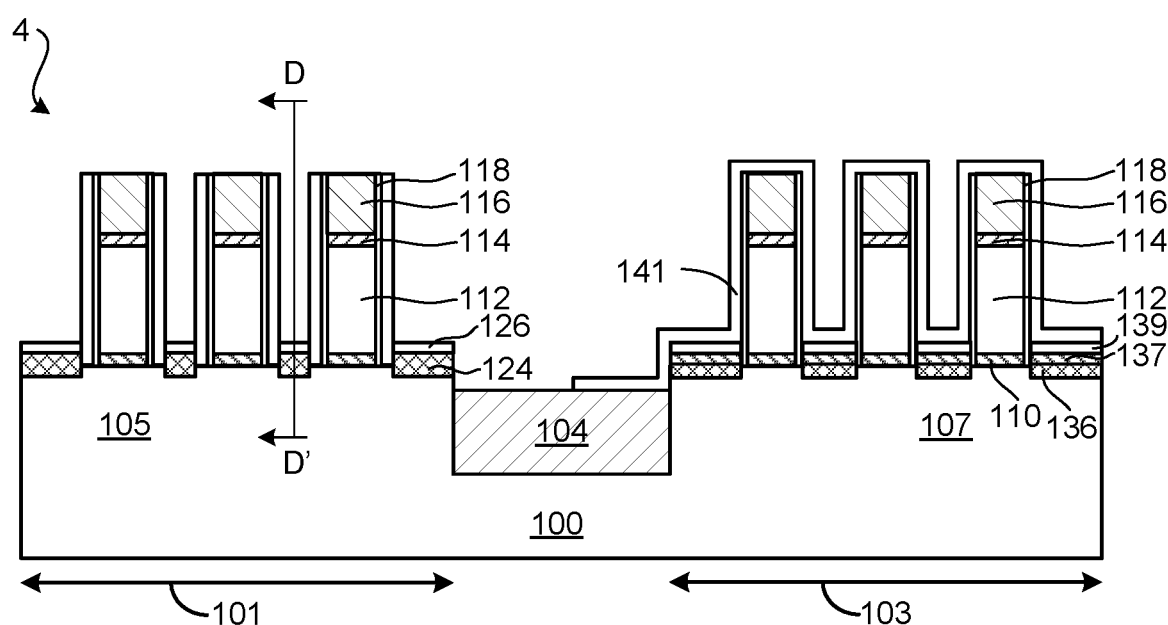
Figure 4I:
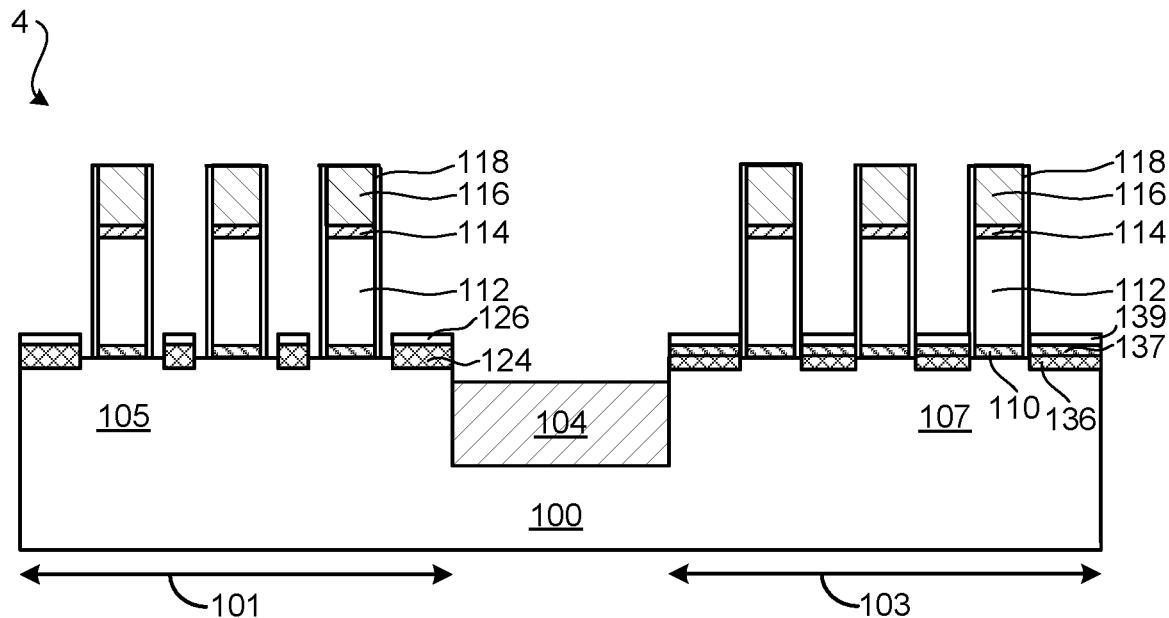
Figure 4J:
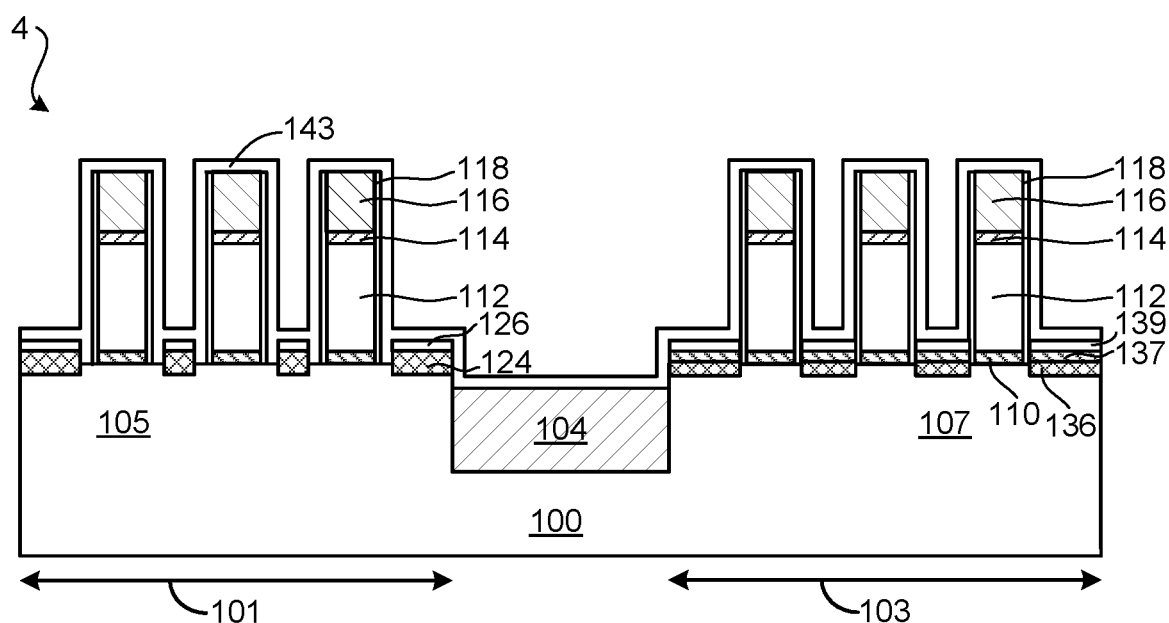
Figure 4K:
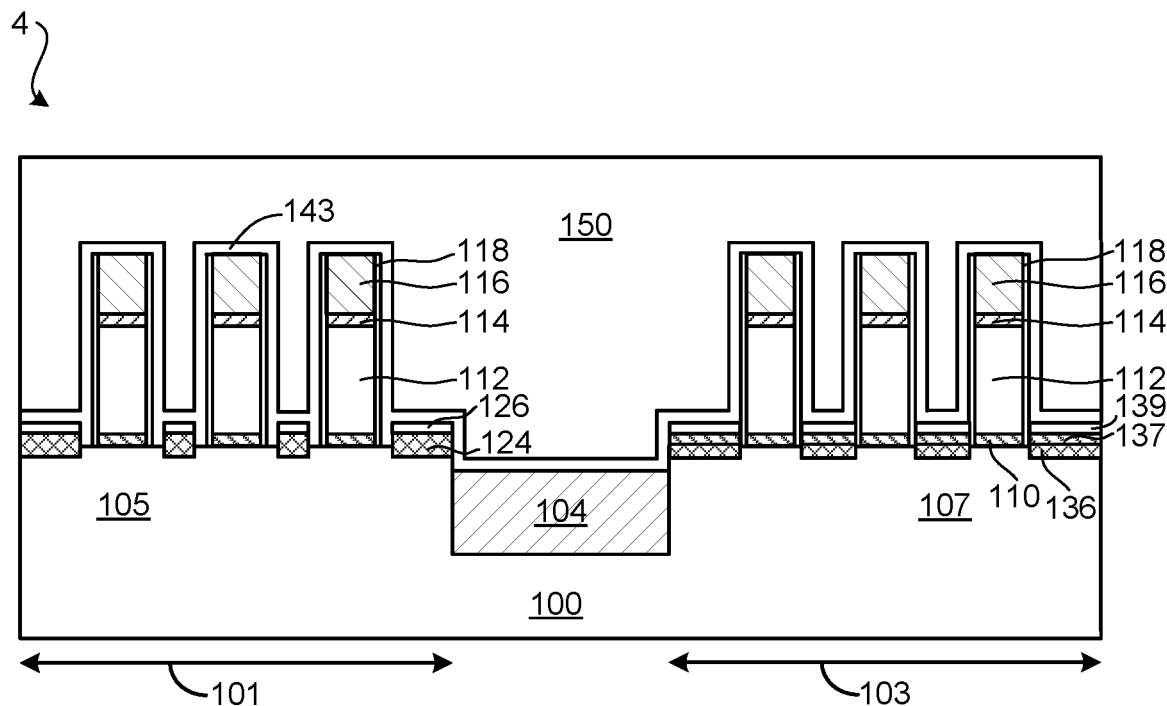
Figure 4L:
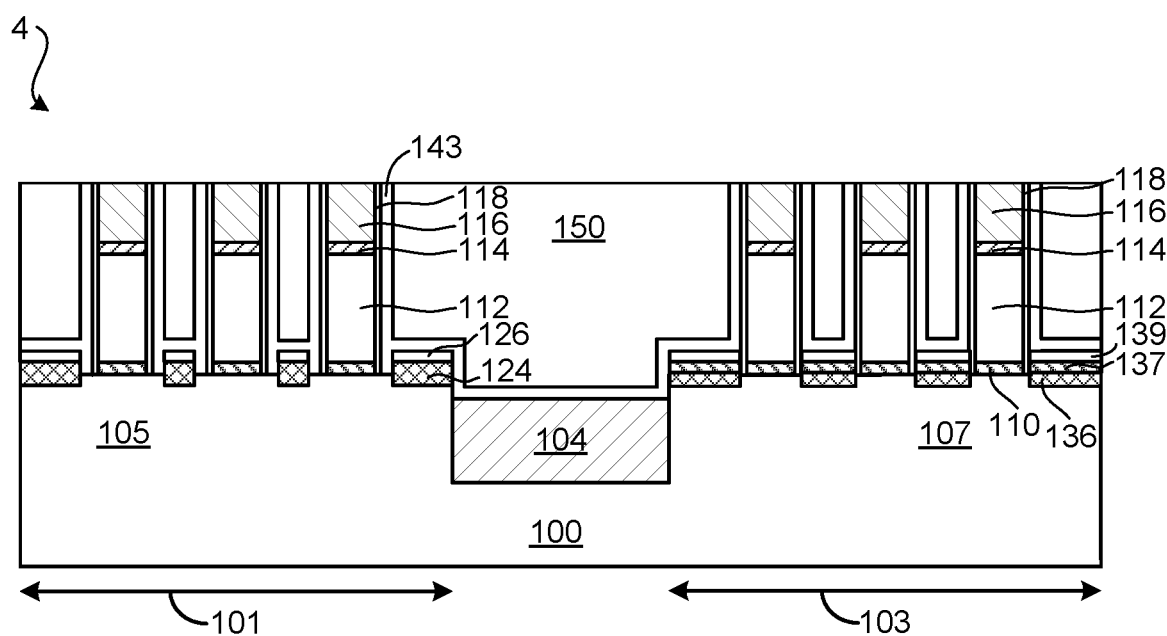
Figure 4M:
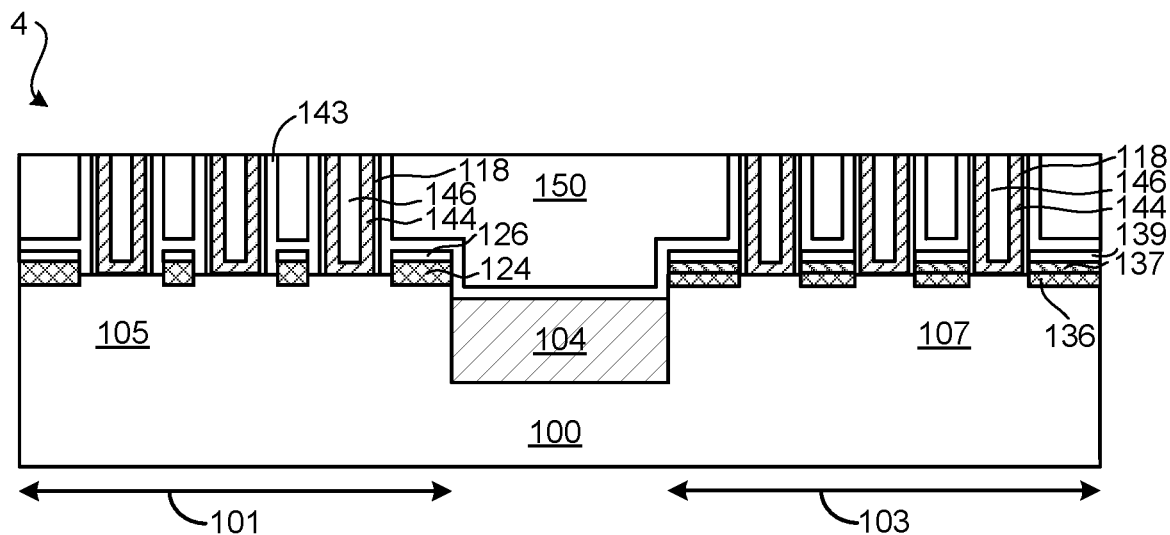
Figure 4N:
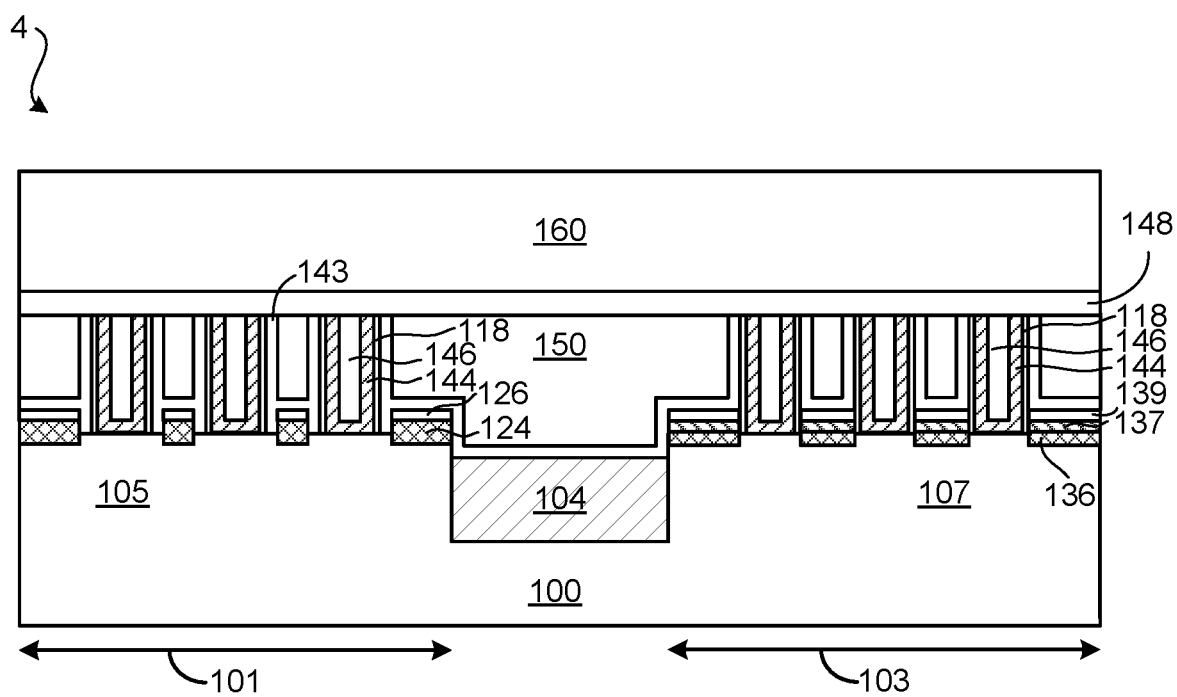
Figure 4O:
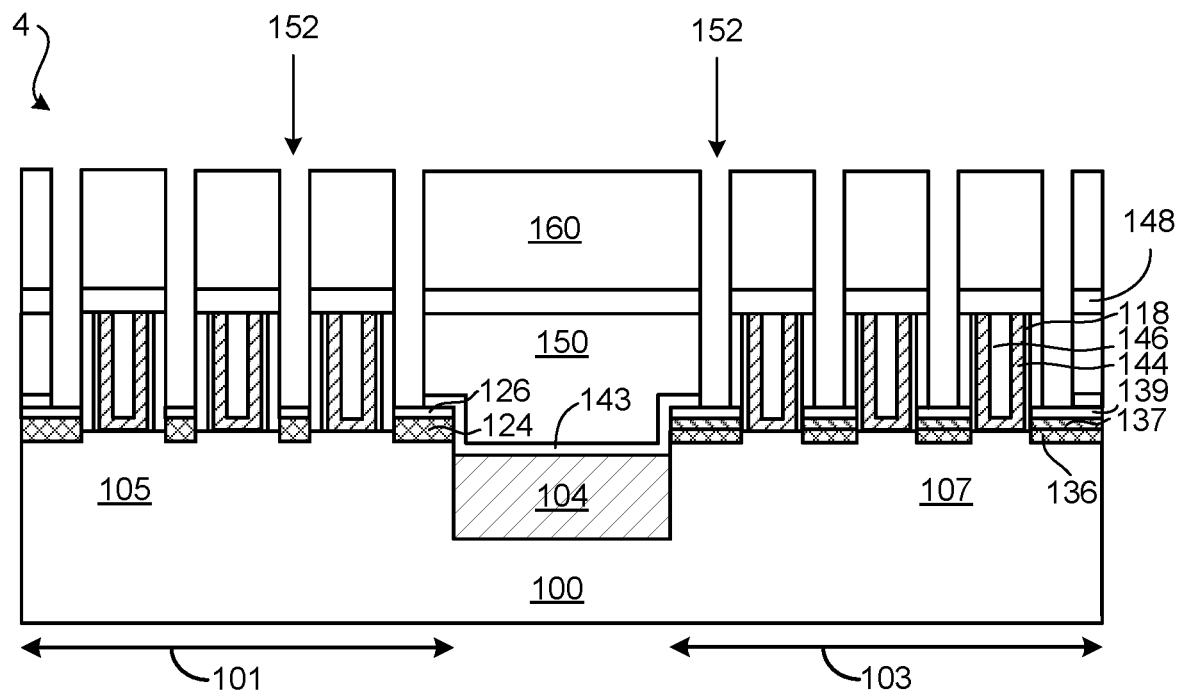
Figure 4P:
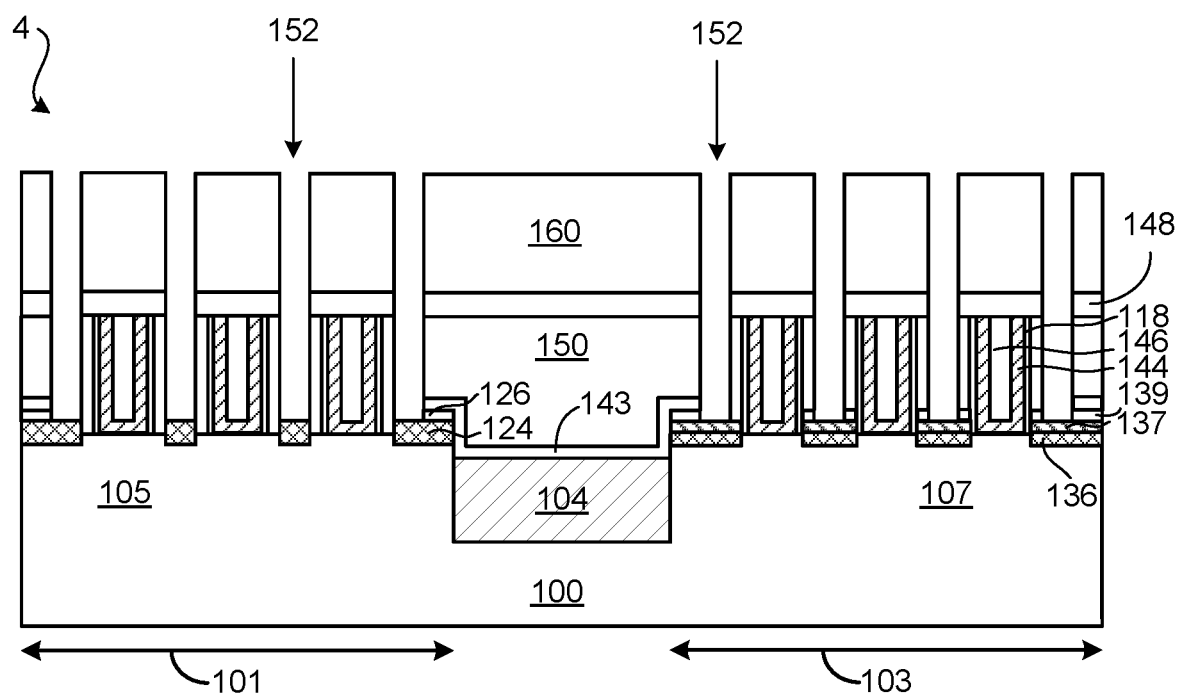
Figure 4Q:
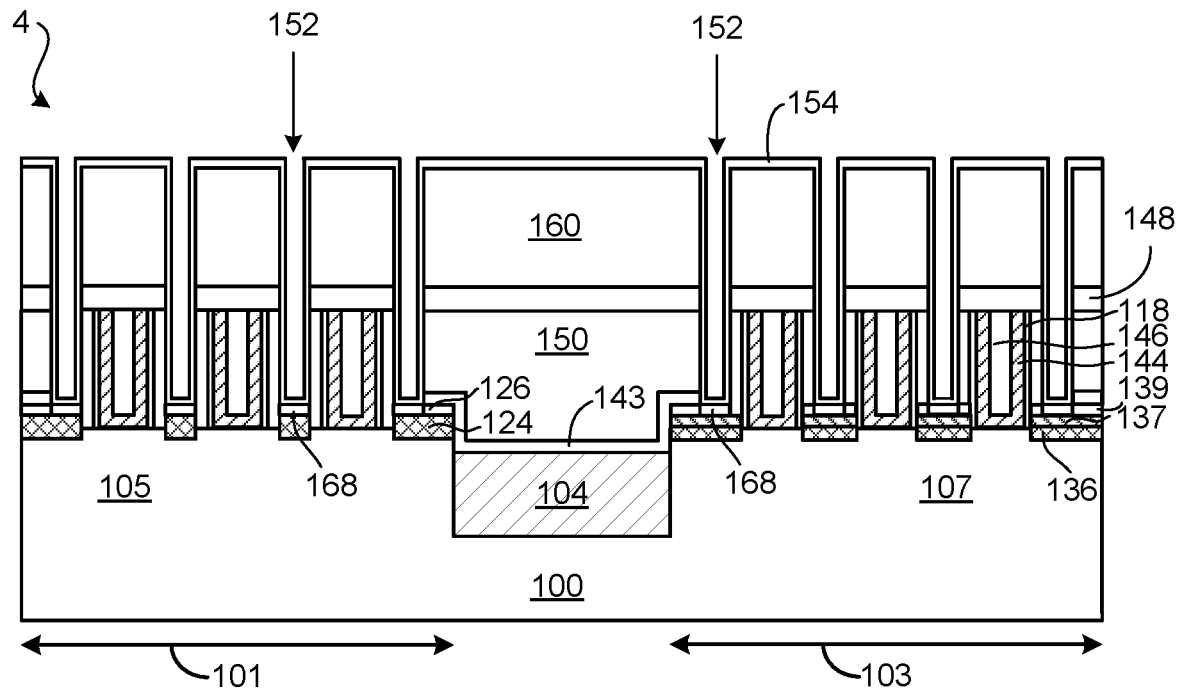
Figure 4R:
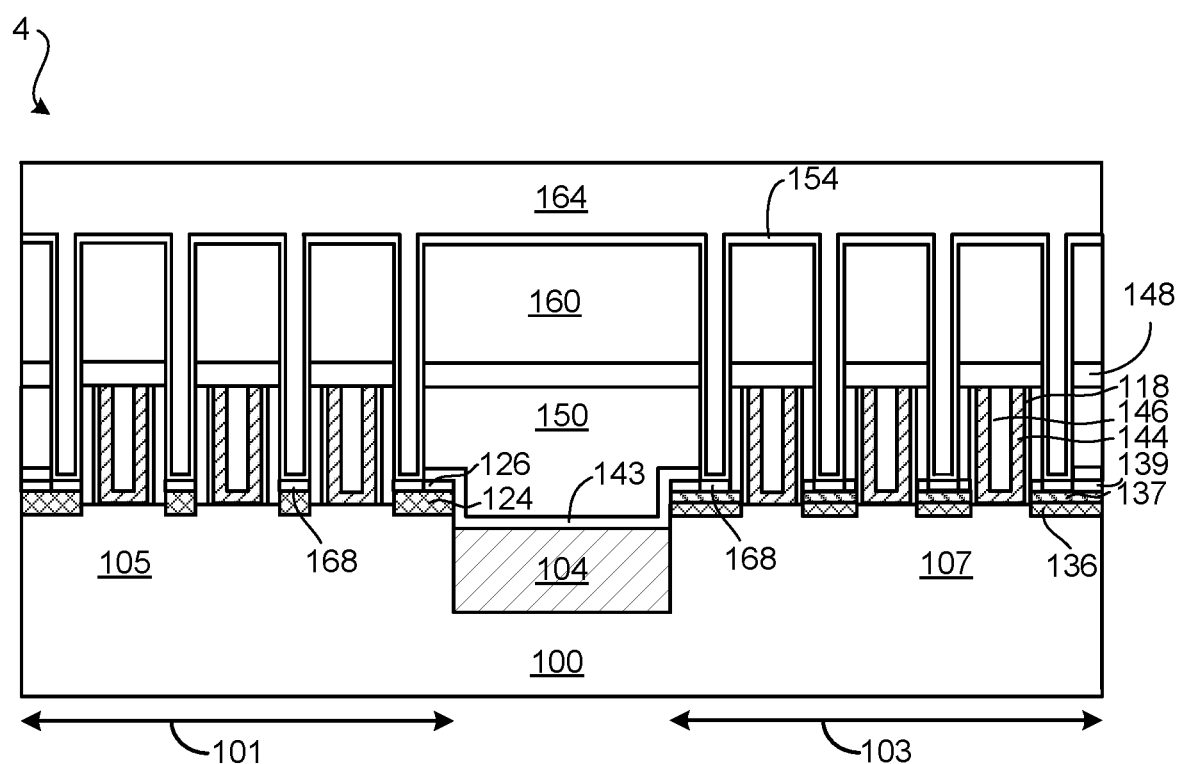
Figure 4S:
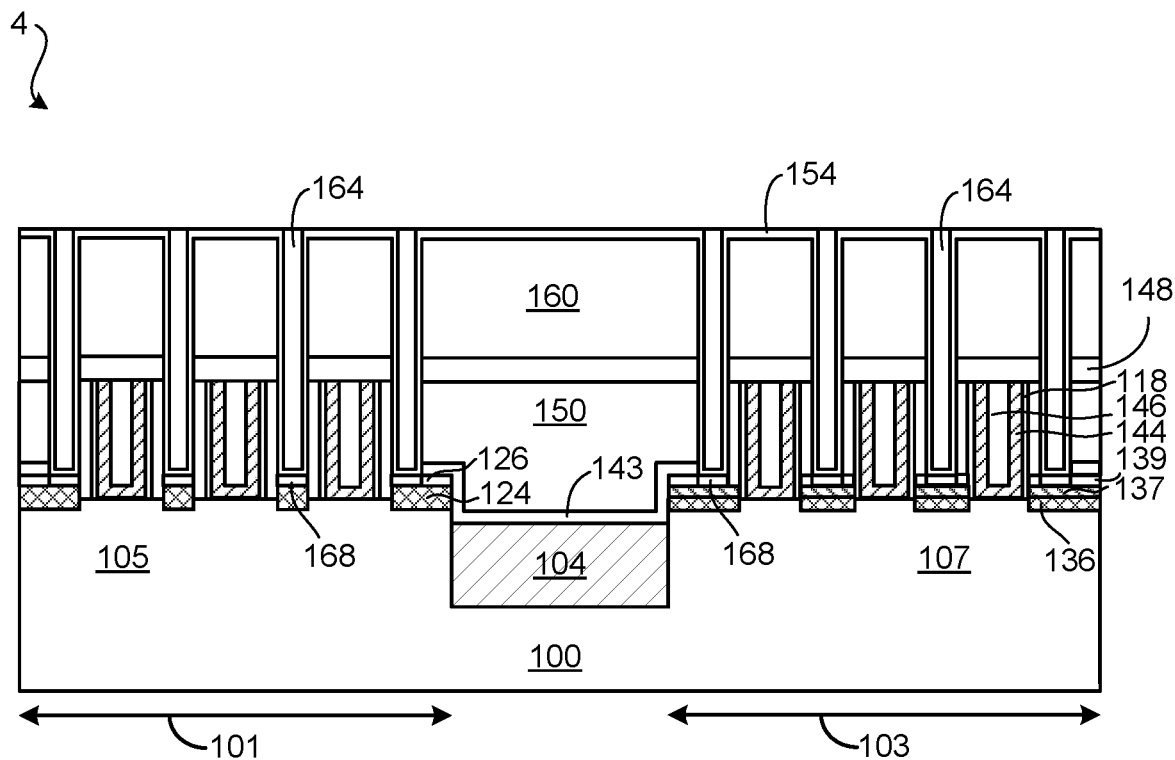
Figure 4T:
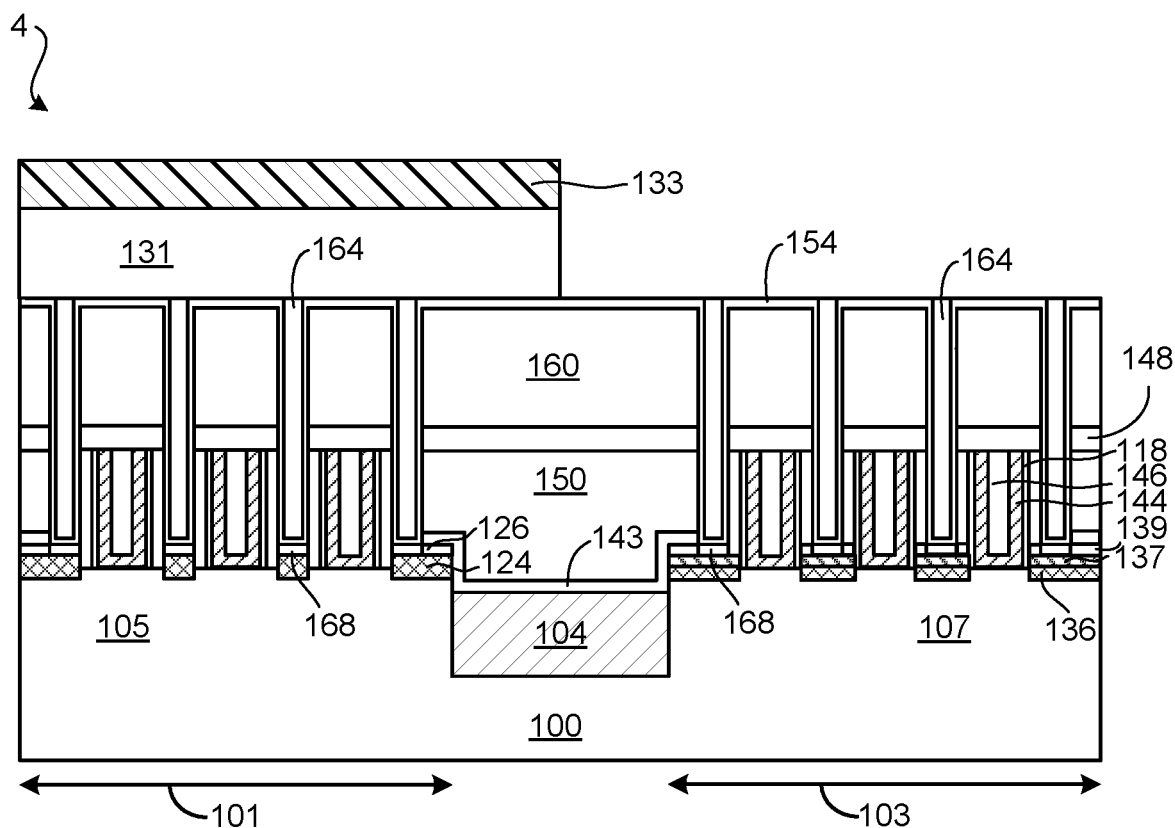
Figure 4U:
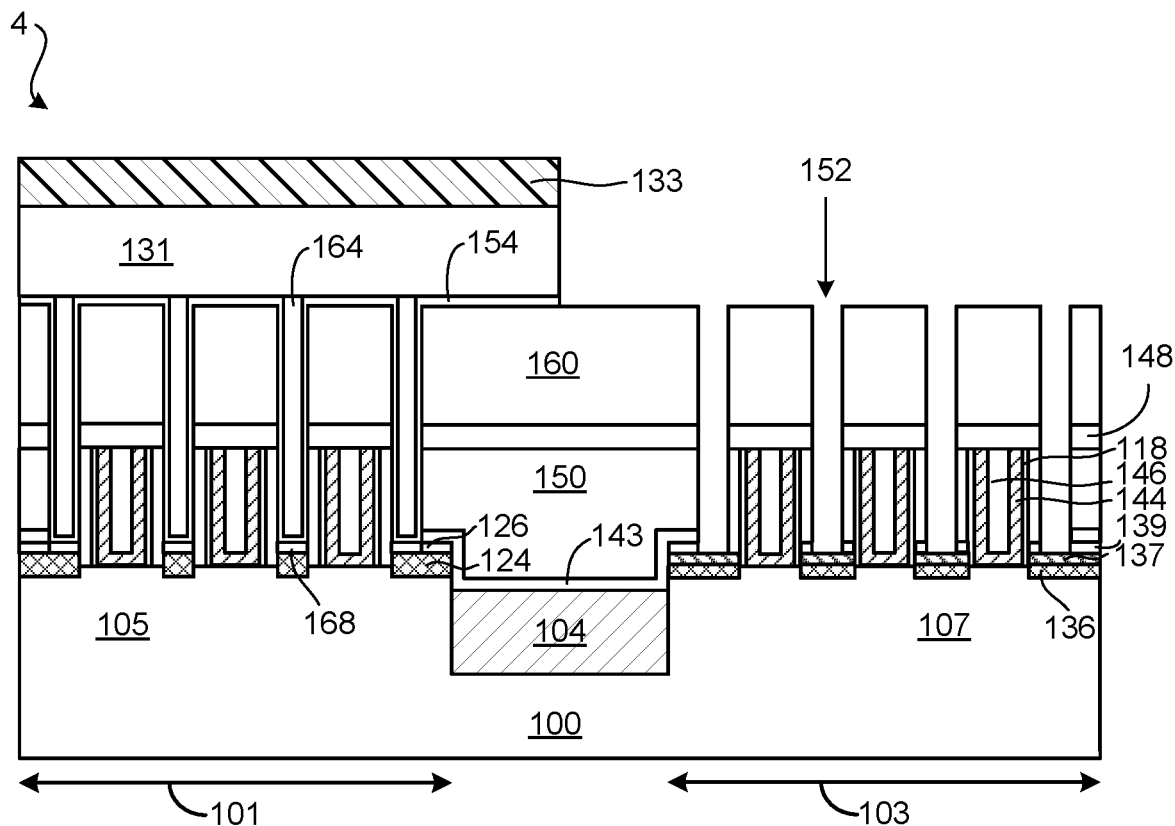
Figure 4V:
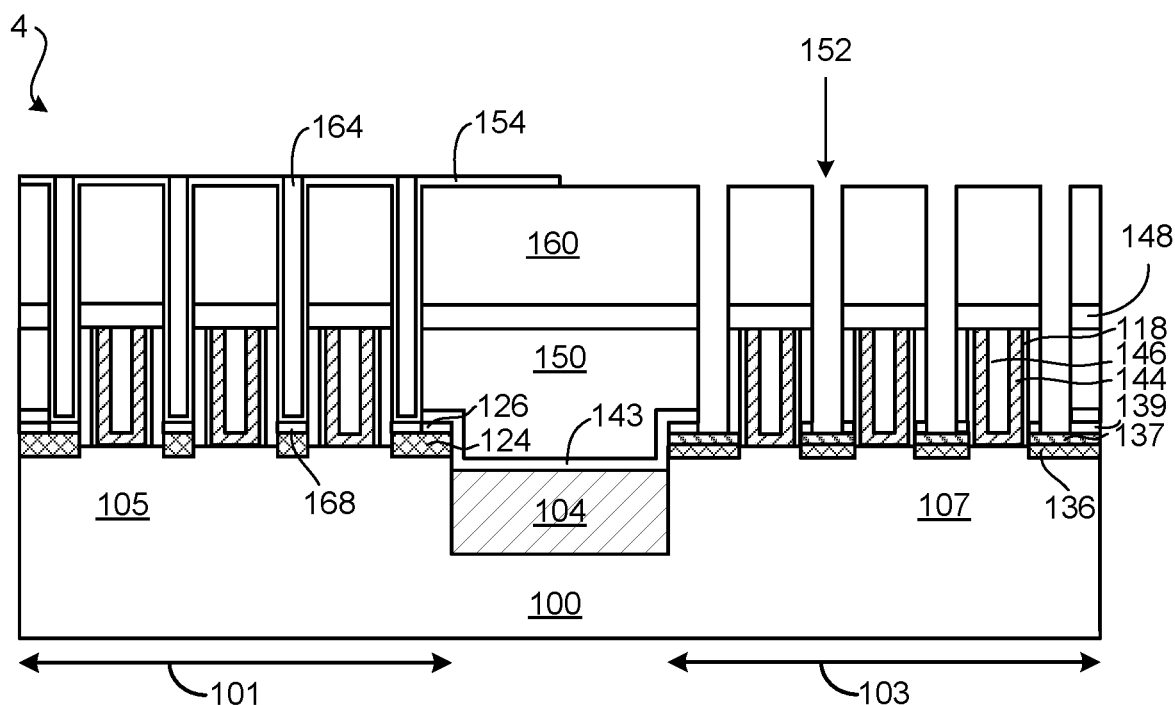
Figure 4W:
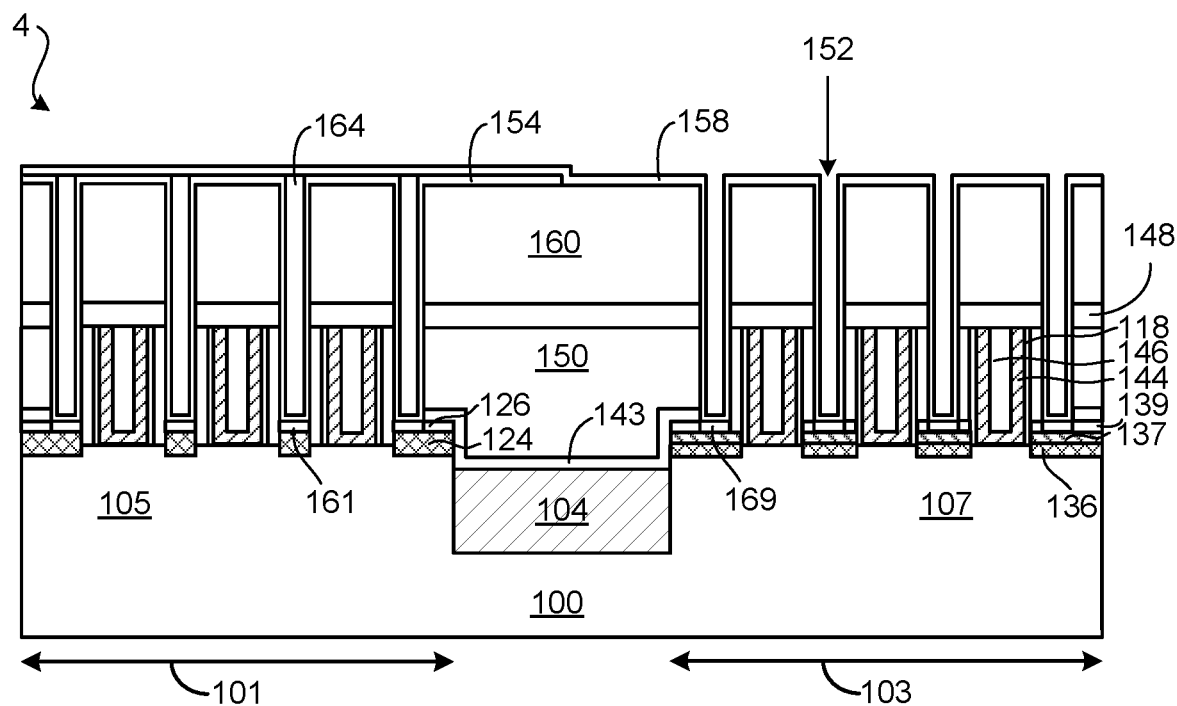
Figure 4X:
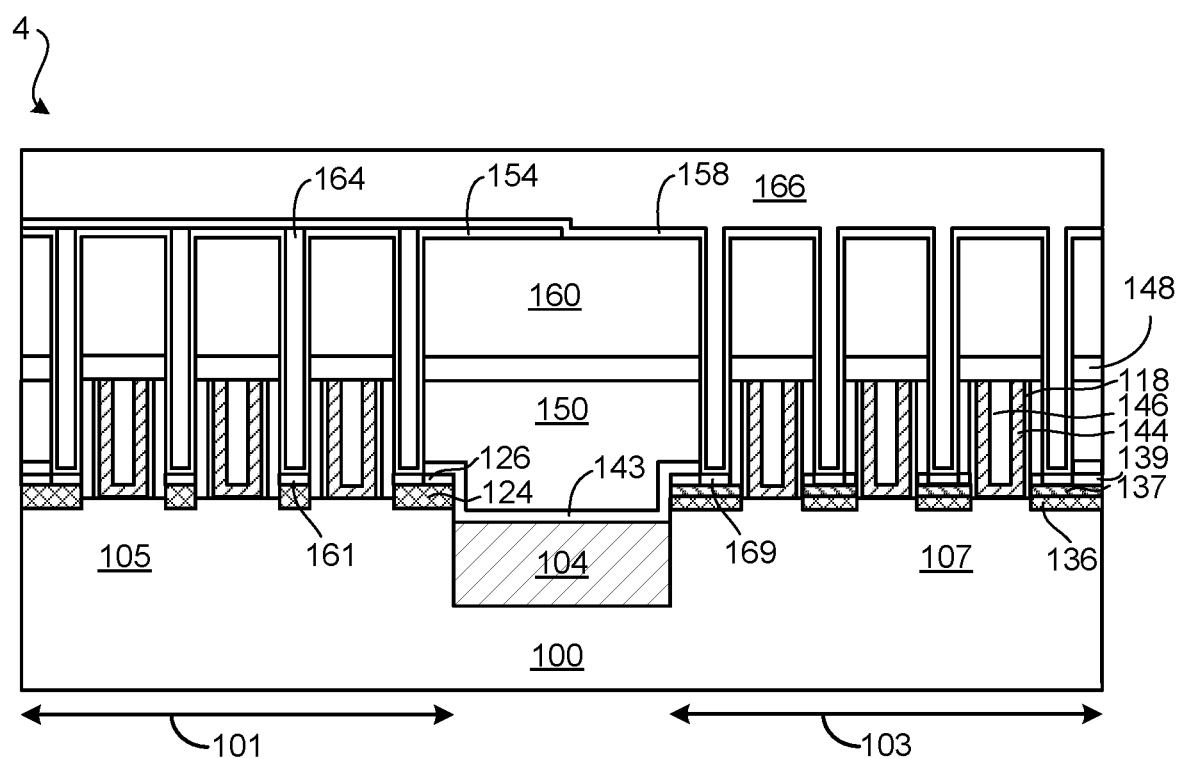
Figure 4Y:
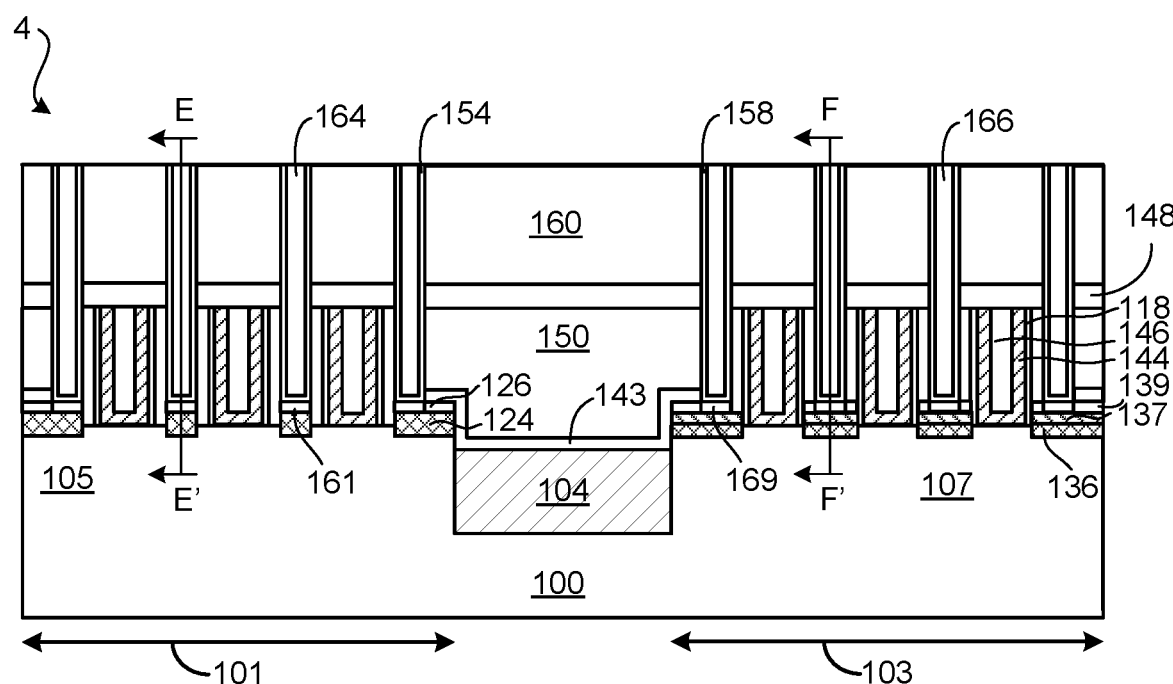

FIGS. 4A-4Y schematically show through cross-sectional views a method of forming a semiconductor device containing dual metal wrap-around contacts according to an embodiment of the invention. Substrate 1 in FIG. 1D has been reproduced as substrate 4 in FIG. 4A.

Figure 6A:
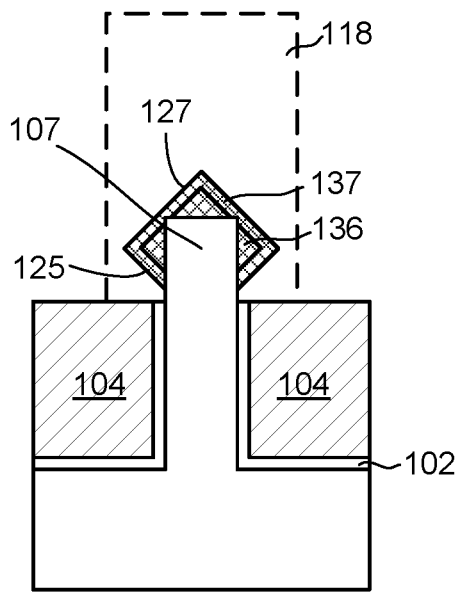
FIGS. 6A-6C schematically show through cross-sectional views a method of forming a semiconductor device containing dual metal wrap-around contacts according to an embodiment of the invention.
Figure 6B:
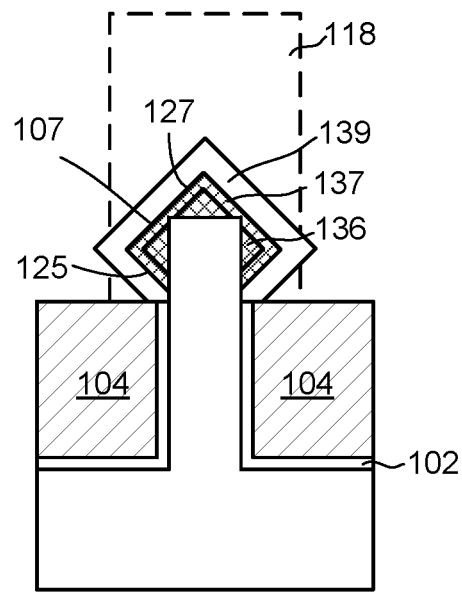

FIG. 4B shows the substrate 4 following selective deposition of a second p-type doped epitaxial semiconductor material 137/136 on exposed surfaces of the second raised feature 107 (e.g., Si fin) in the PFET region 103. The second p-type doped epitaxial semiconductor material 137/136 can be p-type and can, for example, contain boron-doped germanium (Ge:B) on boron-doped silicon germanium (SiGe:B). The selective epitaxial deposition results in the second p-type doped epitaxial semiconductor material 137/136 being faceted and wrapping around the second raised feature 107, where the second p-type doped epitaxial semiconductor material 137/136 has upward facing surfaces and downward facing surfaces. Ge:B may be selectively deposited using GeH$_4$ and BH$_3$ or B$_2$H$_6$. SiGe:B may be selectively deposited using SiH$_4$, Si$_2$H$_6$, or SiH$_2$Cl$_2$, GeH$_4$ and BH$_3$ or B$_2$H$_6$. FIG. 6A shows a cross-sectional view along the line A-A' of FIG. 4B that includes a first downward facing surface 125 and a first upward facing surface 127 of the second epitaxial semiconductor material 137/136.

FIG. 4C shows the substrate 4 following deposition of a fourth metal layer 139 on the second p-type doped epitaxial semiconductor material 137/136. In one example, the fourth metal layer 139 can include ruthenium (Ru) metal. Ru metal deposition can be achieved using a process gas containing Ru$_3$(CO)$_{12}$ and CO. The fourth metal layer 139 wraps around the second p-type doped epitaxial semiconductor material 137/136.

FIG. 4D shows the substrate 4 following conformal deposition of a SiN liner 141 over the raised and recessed features of the substrate 4, and FIG. 4E shows an organic layer 120 that is patterned to cover the PFET region 103 using a patterned photoresist layer 122. In some examples, the organic layer 120 can include an OPL or an ODL. FIG. 4E further shows the substrate 4 following a RIE that removes horizontal portions of the SiN liner 141 in the NFET region 101, while the SiN liner 141 in the PFET region 103 is protected from the RIE. The remaining vertical portions of the SiN liner 141 form sidewall spacers on the patterned film stacks in the NFET region 101. FIG. 4F shows the substrate 4 following removal of the organic layer 120 and the patterned photoresist layer 122 from the PFET region 103.

Figure 5A:
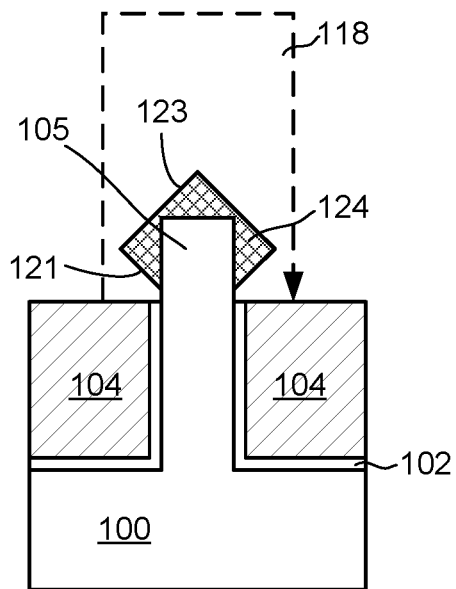
FIGS. 5A-5C schematically show through cross-sectional views a method of forming a semiconductor device containing dual metal wrap-around contacts according to an embodiment of the invention.

FIG. 4G shows the substrate 4 following selective deposition of a first n-type doped epitaxial semiconductor material 124 on exposed surfaces of the first raised feature 105 (e.g., Si fin) in the NFET region 101. The first n-type doped epitaxial semiconductor material 124 can, for example, contain n-type doped Si that includes phosphor-doped silicon (Si:P) or arsenic-doped silicon (Si:As). The selective epitaxial deposition results in the first n-type doped epitaxial semiconductor material 124 wrapping around the first raised feature 105, where the first n-type doped epitaxial semiconductor material 124 has upward facing surfaces and downward facing surfaces. Si:P may be selectively deposited using SiH$_4$, Si$_2$H$_6$ or SiH$_2$Cl$_2$ and PH$_3$. Si:As may be selectively deposited using SiH$_4$, Si$_2$H$_6$ or SiH$_2$Cl$_2$ and AsH$_3$. FIG. 5A shows a cross-sectional view along the line C-C' of FIG. 4G that includes a first downward facing surface 121 and a first upward facing surface 123 of the first n-type doped epitaxial semiconductor material 124.

Figure 5B:
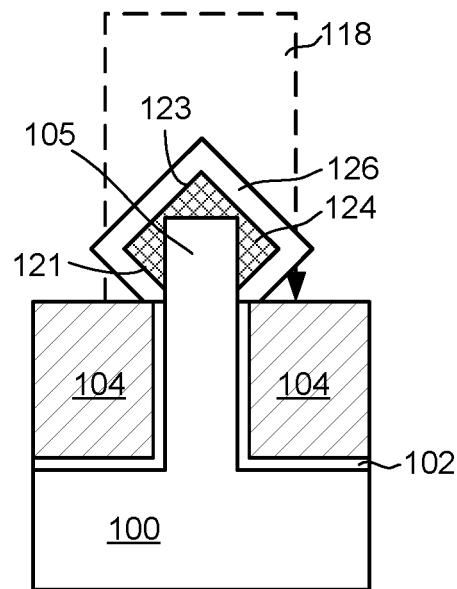

FIG. 4H shows the substrate 4 following deposition of a fifth metal layer 126 on the first n-type doped epitaxial semiconductor material 124. In one example, the fifth metal layer 126 can include ruthenium (Ru) metal. Ru metal deposition can be achieved using a process gas containing Ru$_3$(CO)$_{12}$ and CO. The fifth metal layer 126 wraps around the first n-type doped epitaxial semiconductor material 124. FIG. 5B shows a cross-sectional view along the line D-D' of FIG. 4H that includes the first metal layer 126 on the first downward facing surface 121 and on the first upward facing surface 123 of the first n-type doped epitaxial semiconductor material 124. FIG. 4I shows the substrate 4 following removal of the SiN liner 141 from the substrate 4.

FIG. 4J shows the substrate 4 following conformal deposition of a SiN liner 143 over the raised and recessed features of the substrate 4, and FIG. 4K shows the substrate 4 following blanket deposition of a gap-fill oxide film 150, were the gap-fill oxide film 150 may be deposited using a flowable oxide and a SiH$_4$-based oxide, for example. FIG. 4L shows the substrate 1 following a planarization process that stops on the SiN hard mask 116. In one example, the planarization process can include CMP.

FIG. 4M shows the substrate 4 following removal of the patterned film stacks and replacement with a high-k layer 144 and a metal gate layer 146. FIG. 4N shows the substrate 4 following deposition of a SiN liner 148 and an interlayer dielectric (ILD) 160 on the SiN liner 148. Thereafter, as shown in FIG. 4O, a self-aligned contact etching process is performed to form recessed features 152 down to the fourth metal layer 139 in the PFET region 103 and the fifth metal layer 126 in the NFET region 101. FIG. 4P shows the substrate 1 following an etching process that etches through the fourth metal layer 139 and stops on the second p-type doped epitaxial semiconductor material 137/136, and etches through the fifth metal layer 126 and stops on the first n-type doped epitaxial semiconductor material 124.

Thereafter, as shown in FIG. 4Q, a sixth metal layer 168 (e.g., a Ti layer) is deposited in the recessed features 152 and a titanium nitride (TiN) layer 154 is conformally deposited on the substrate 4, including in the recessed features 152. In some examples, the sixth metal layer 168 may react to form a metal silicide (e.g., $TiSi_x$). In one example, the TiN layer 154 can have a thickness of less than about 3 nm. FIG. 4R shows the substrate 4 following blanket deposition of a tungsten (W) metal layer 164 that fills the recess features 152. Thereafter, as shown in FIG. 4S, the W metal layer 164 is planarized down to the TiN layer 154.

FIG. 4T shows an organic layer 131 that is deposited and patterned to cover the NFET region 101 using a patterned photoresist layer 133. In some examples, the organic layer 131 can include an OPL or an ODL. FIG. 4U further shows the substrate 4 following a RIE process that removes the TiN layer 154, the W metal layer 164, and the sixth metal layer 168 from the PFET region 103, while the TiN layer 154, the W metal layer 164 and the sixth metal layer 168 in the NFET region 101 are protected from the RIE by the organic layer 131. FIG. 4V shows the substrate 1 following removal of the organic layer 131 and the patterned photoresist layer 133 from the NFET region 101.

FIG. 4W shows the substrate 4 following selective deposition of a seventh metal layer 169 (e.g., a Ru layer or a NiPt layer) on the second p-type doped epitaxial semiconductor material 137/136 in the recessed features 152 and a blanked deposition of a TiN layer 158. FIG. 4X shows the substrate 1 following blanket deposition a W metal layer 166 that fills the recess features 152 in the PFET region 103. Thereafter, as shown in FIG. 4Y, the W metal layer 166 is planarized.

Figure 5C:
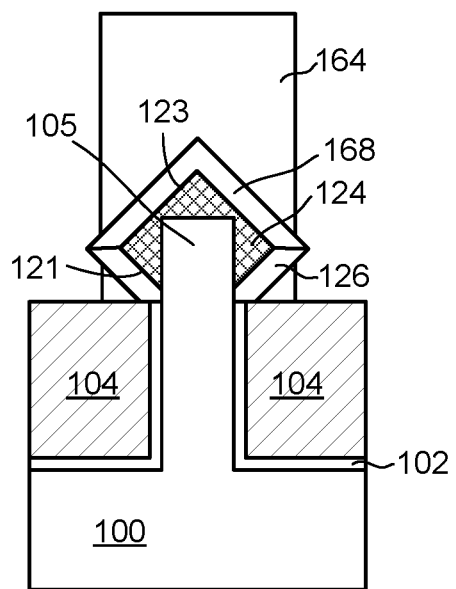
Figure 6C:
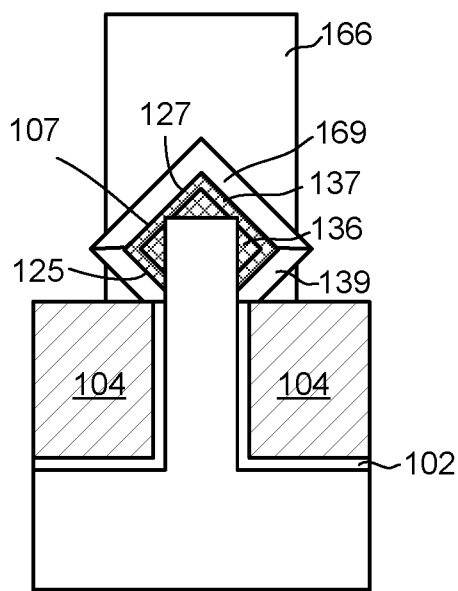

FIG. 5C shows a cross-sectional view along the line E-E' of FIG. 4Y that includes the fifth metal layer 126 (first contact metal) on the first downward facing surface 121 and the sixth metal layer 168 (second contact metal) on the first upward facing surface 123. Similarly, FIG. 6C shows a cross-sectional view along the line F-F' of FIG. 4Y that includes the fourth metal layer 139 (third contact metal) on the second downward facing surface 125 and the seventh metal layer 169 (fourth contact metal) on the second upward facing surface 127.

A plurality of embodiments for low-resistivity dual metal wrap-around contacts in aggressively scaled devices have been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
   providing a first raised feature in a n-type channel field effect transistor (NFET) region on a substrate;
   growing a first n-type doped epitaxial semiconductor material on the first raised feature, the first n-type doped epitaxial semiconductor material having a first upward facing surface and a first downward facing surface;
   forming a first contact metal on the first downward facing surface;
   forming a second contact metal on the first upward facing surface;
   providing a second raised feature in a p-type channel field effect transistor (PFET) region on the substrate;
   growing a second p-type doped epitaxial semiconductor material on the second raised feature, the second p-type doped epitaxial semiconductor material having a second upward facing surface and a second downward facing surface;
   forming a third contact metal on the second downward facing surface; and
   forming a fourth contact metal on the second upward facing surface, wherein the fourth contact metal is different from the second contact metal, and the first contact metal is the different from the third contact metal.

2. The method of claim 1, wherein the first n-type doped epitaxial semiconductor material contains Si:P or Si:As, the first contact metal contains Ru or Ti, and the second contact metal contains Ti or $TiSi_x$.

3. The method of claim 1, wherein the second p-type doped epitaxial semiconductor material contains Si:B or SiGe:B, the third contact metal contains Ru or Ti, and the fourth contact metal contains NiPt or Ru.

4. The method of claim 1, wherein the first and second raised features are fins that extend through a shallow trench isolation (STI) layer.

5. The method of claim 1, wherein forming the first contact metal on the first downward facing surface and forming the second contact metal on the first upward facing surface includes:
   conformally depositing the first contact metal on the first upward facing surface and on the first downward facing surface;
   removing the first contact metal from the first upward facing surface; and
   depositing the second contact metal on the first upward facing surface.

6. The method of claim 1, wherein forming the third contact metal on the second downward facing surface and forming the fourth contact metal on the second upward facing surface includes:
   conformally depositing the third contact metal on the second upward and downward facing surfaces;
   removing the third contact metal from the second upward facing surface; and
   depositing the fourth contact metal on the second upward facing surface.

7. A method of forming a semiconductor device, the method comprising:
   providing a first raised feature in a n-type channel field effect transistor (NFET) region on a substrate;
   growing a first n-type doped epitaxial semiconductor material on the first raised feature, the first n-type doped epitaxial semiconductor material having a first upward facing surface and a first downward facing surface;
   forming a first contact metal on the first downward facing surface;

forming a second contact metal on the first upward facing surface;

providing a second raised feature in a p-type channel field effect transistor (PFET) region on the substrate;

growing a second p-type doped epitaxial semiconductor material on the second raised feature, the second p-type doped epitaxial semiconductor material having a second upward facing surface and a second downward facing surface;

forming a third contact metal on the second downward facing surface; and forming a fourth contact metal on the second upward facing surface, wherein the fourth contact metal is different from the second contact metal, the first contact metal is the different from the third contact metal, the first n-type doped epitaxial semiconductor material contains Si:P or Si:As, the first contact metal contains Ti, and the second contact metal contains Ti or TiSi$_x$.

8. The method of claim 7, wherein the second p-type doped epitaxial semiconductor material contains Si:B or SiGe:B, the third contact metal contains Ru, and the fourth contact metal contains NiPt or Ru.

9. The method of claim 7, wherein the first and second raised features are fins that extend through a shallow trench isolation (STI) layer.

10. The method of claim 7, wherein forming the first contact metal on the first downward facing surface and forming the second contact metal on the first upward facing surface includes:

conformally depositing the first contact metal on the first upward facing surface and on the first downward facing surface;

removing the first contact metal from the first upward facing surface; and depositing the second contact metal on the first upward facing surface.

11. The method of claim 7, wherein forming the third contact metal on the second downward facing surface and forming the fourth contact metal on the second upward facing surface includes:

conformally depositing the third contact metal on the second upward and downward facing surfaces;

removing the third contact metal from the second upward facing surface; and depositing the fourth contact metal on the second upward facing surface.

12. A method of forming a semiconductor device, the method comprising:

providing a first raised feature in a n-type channel field effect transistor (NFET) region on a substrate;

growing a first n-type doped epitaxial semiconductor material on the first raised feature, the first n-type doped epitaxial semiconductor material having a first upward facing surface and a first downward facing surface;

forming a first contact metal on the first downward facing surface;

forming a second contact metal on the first upward facing surface;

providing a second raised feature in a p-type channel field effect transistor (PFET) region on the substrate;

growing a second p-type doped epitaxial semiconductor material on the second raised feature, the second p-type doped epitaxial semiconductor material having a second upward facing surface and a second downward facing surface;

forming a third contact metal on the second downward facing surface; and forming a fourth contact metal on the second upward facing surface, wherein the fourth contact metal is different from the second contact metal, the first contact metal is the different from the third contact metal, the second p-type doped epitaxial semiconductor material contains Si:B or SiGe:B, the third contact metal contains Ru, and the fourth contact metal contains NiPt or Ru.

13. The method of claim 12, wherein the first n-type doped epitaxial semiconductor material contains Si:P or Si:As, the first contact metal contains Ti, and the second contact metal contains Ti or TiSi$_x$.

14. The method of claim 12, wherein the first and second raised features are fins that extend through a shallow trench isolation (STI) layer.

15. The method of claim 12, wherein forming the first contact metal on the first downward facing surface and forming the second contact metal on the first upward facing surface includes:

conformally depositing the first contact metal on the first upward facing surface and on the first downward facing surface;

removing the first contact metal from the first upward facing surface; and depositing the second contact metal on the first upward facing surface.

16. The method of claim 12, wherein forming the third contact metal on the second downward facing surface and forming the fourth contact metal on the second upward facing surface includes:

conformally depositing the third contact metal on the second upward and downward facing surfaces;

removing the third contact metal from the second upward facing surface; and depositing the fourth contact metal on the second upward facing surface.

* * * * *